(12) United States Patent
Tetelbaum et al.

(10) Patent No.: US 6,948,142 B2
(45) Date of Patent: Sep. 20, 2005

(54) INTELLIGENT ENGINE FOR PROTECTION AGAINST INJECTED CROSSTALK DELAY

(75) Inventors: Alexander Tetelbaum, Hayward, CA (US); Ruben Molina, Jr., San Ramon, CA (US)

(73) Assignee: LSI Logic Corporation, Milpitas, CA (US)

( * ) Notice: Subject to any disclaimer, the term of this patent is extended or adjusted under 35 U.S.C. 154(b) by 76 days.

(21) Appl. No.: 10/453,819

(22) Filed: Jun. 2, 2003

(65) Prior Publication Data

US 2004/0243956 A1 Dec. 2, 2004

(51) Int. Cl.[7] .............................................. G06F 17/50
(52) U.S. Cl. ................................ 716/6; 716/4; 716/18
(58) Field of Search .................................. 716/6, 4, 18

(56) References Cited

U.S. PATENT DOCUMENTS 6,721,930 B2 * 4/2004 Sasaki et al. .................. 716/6

OTHER PUBLICATIONS

M. Cuviello et al., Fault Modeling and Simulation for Crosstalk in System–on–Chip Interconnects, Proceedings of the 1999 IEEE/ACM International Conference on Compute–Aided Design, pp. 297–303, Nov. 1999.*

* cited by examiner

Primary Examiner—A. M. Thompson
(74) Attorney, Agent, or Firm—Fitch, Even, Tabin & Flannery

(57) ABSTRACT

A method of protecting a net of an integrated circuit against injected crosstalk delay includes receiving a synthesized signal path structure and a value of maximum allowable injected crosstalk delay for a selected net in the signal path structure. The signal path structure is analyzed to calculate a skew correction and a net ramptime for the selected net. An injected crosstalk delay of the selected net is estimated from a net aggressor. A crosstalk protection scheme is selected for the selected net to minimize chip area of the integrated circuit while ensuring that the injected crosstalk delay of the selected net does not exceed the value of maximum allowable injected crosstalk delay.

18 Claims, 14 Drawing Sheets

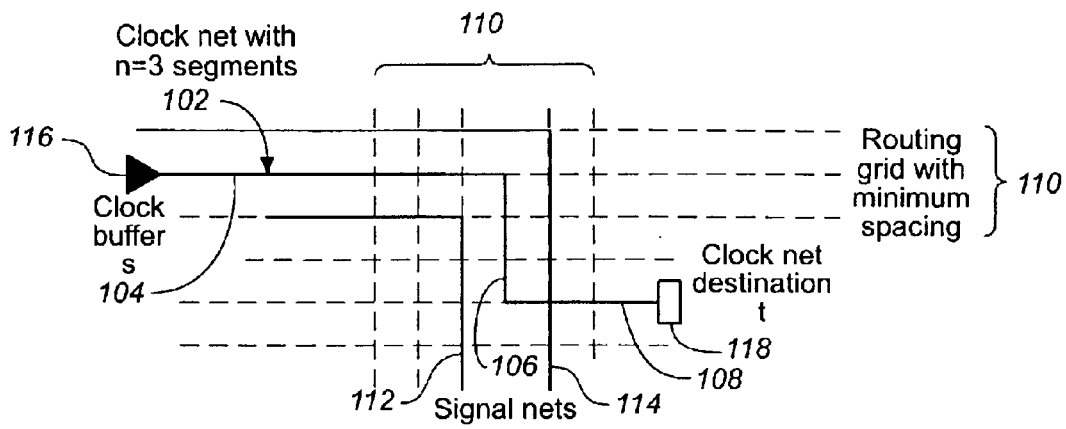
FIG._1A
*(PRIOR ART)*
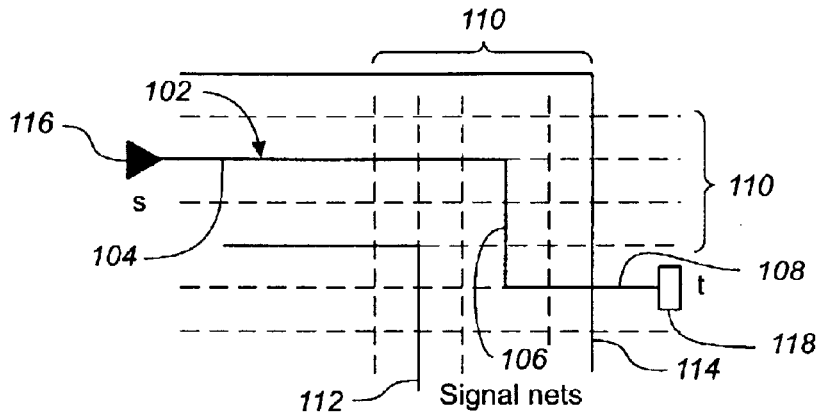
FIG._2
*(PRIOR ART)*
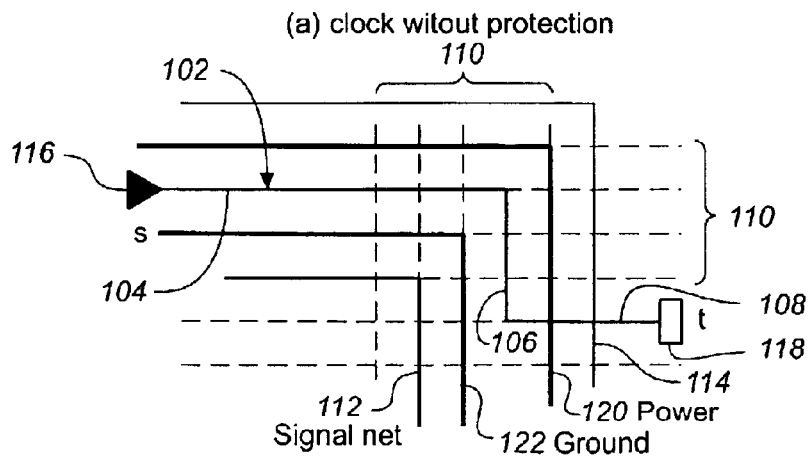
FIG._3
*(PRIOR ART)*

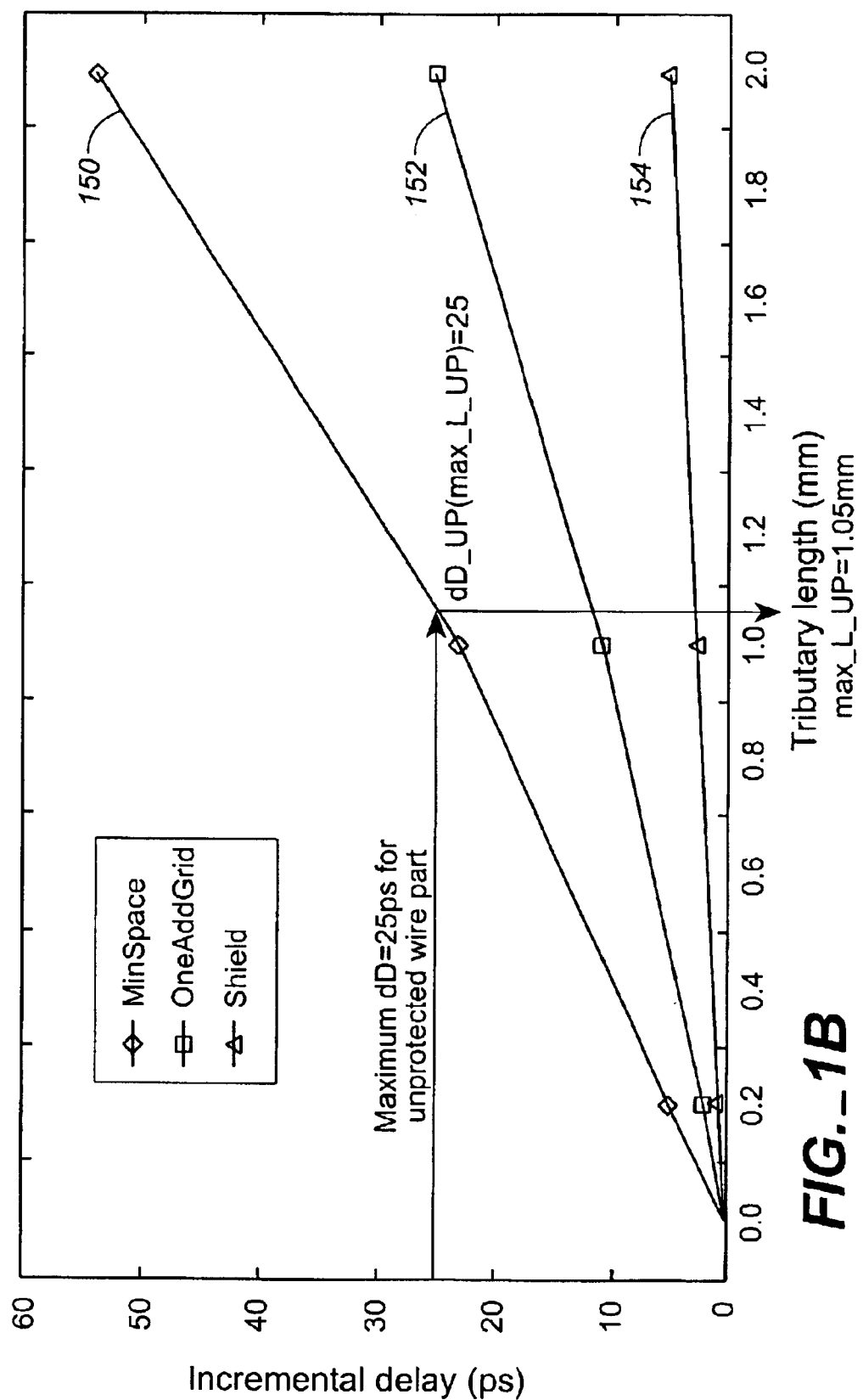
FIG._1B

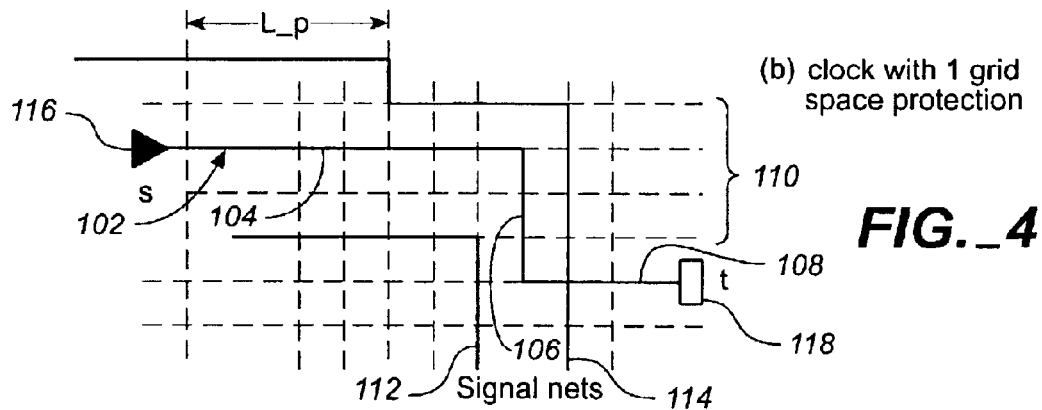
(b) clock with 1 grid space protection
FIG._4
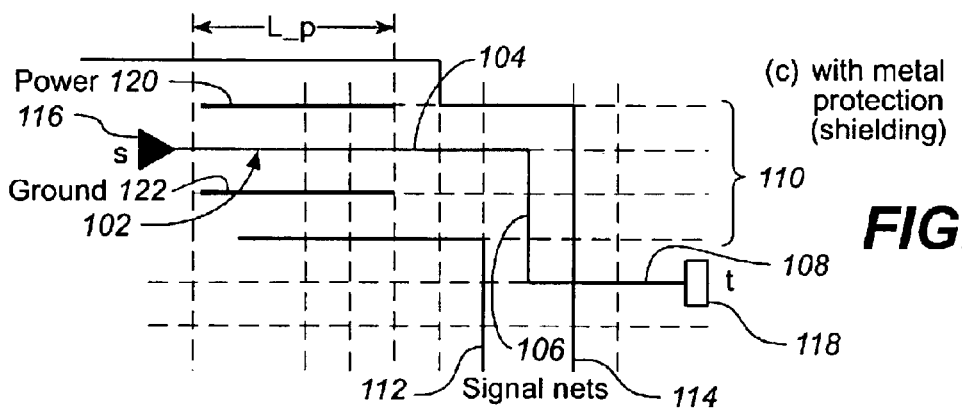
(c) with metal protection (shielding)
FIG._5
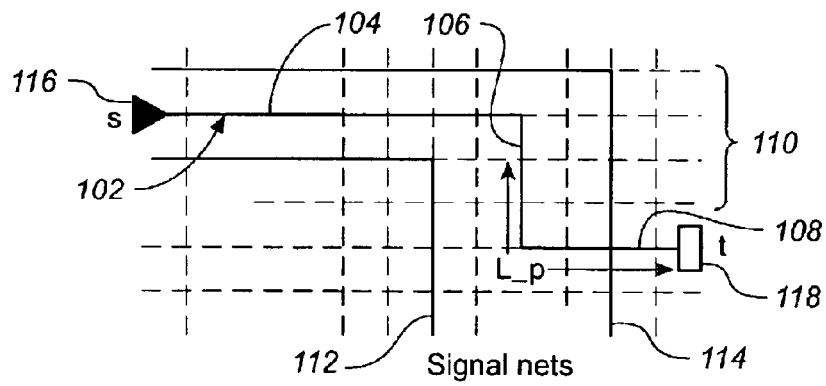
FIG._6
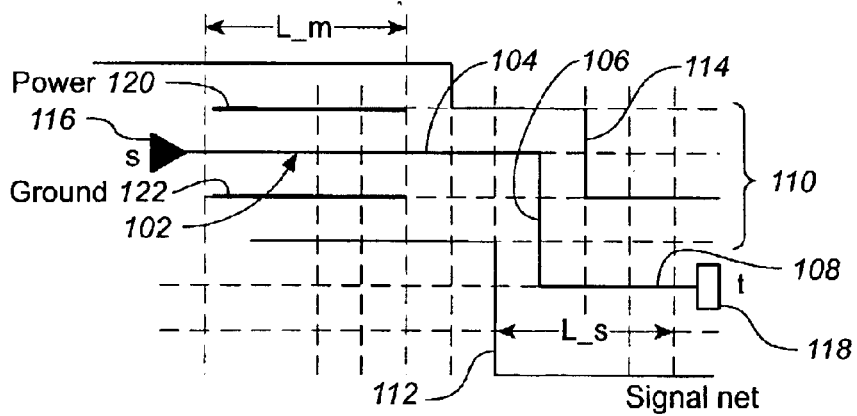
FIG._7

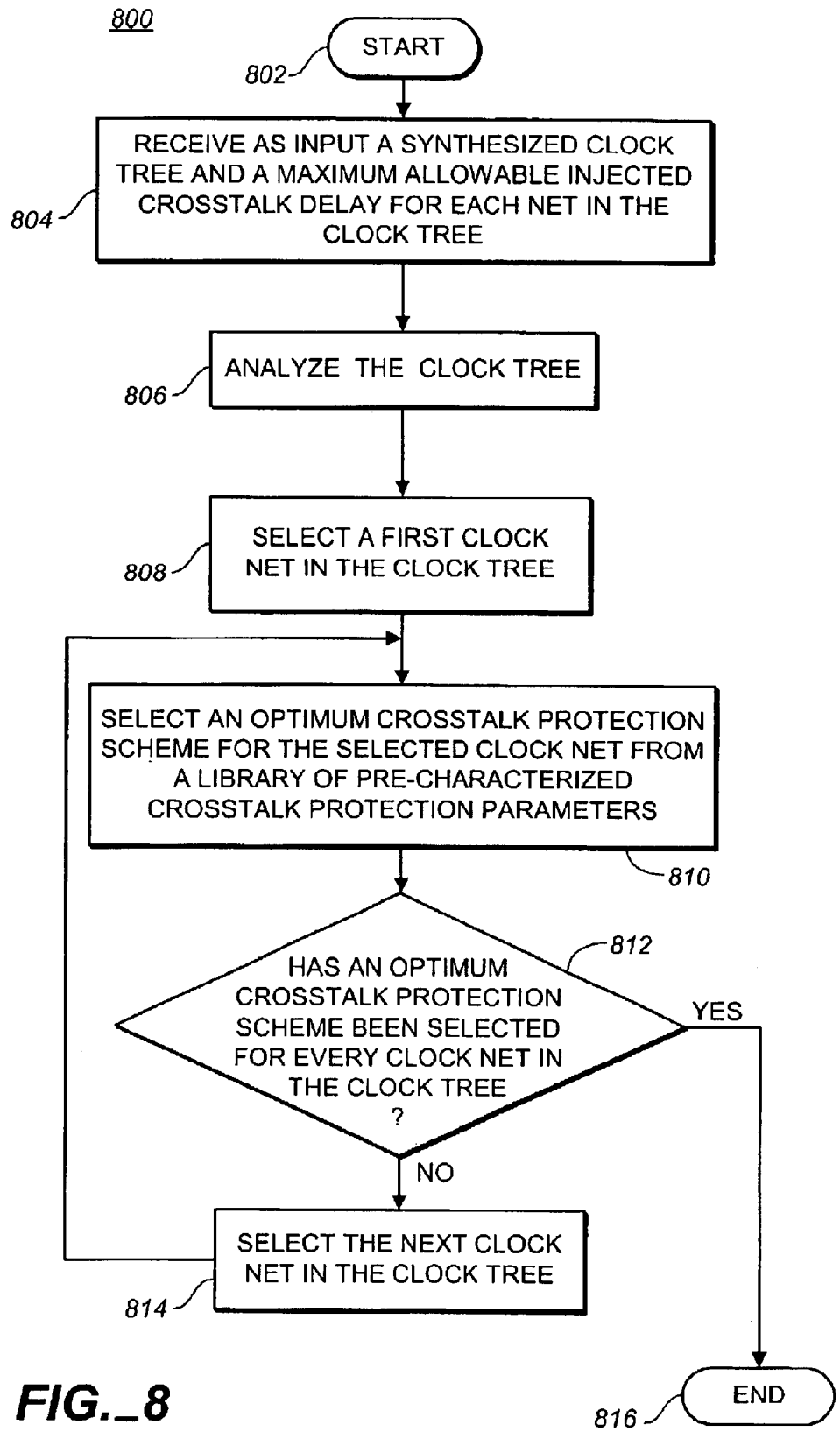
FIG._8

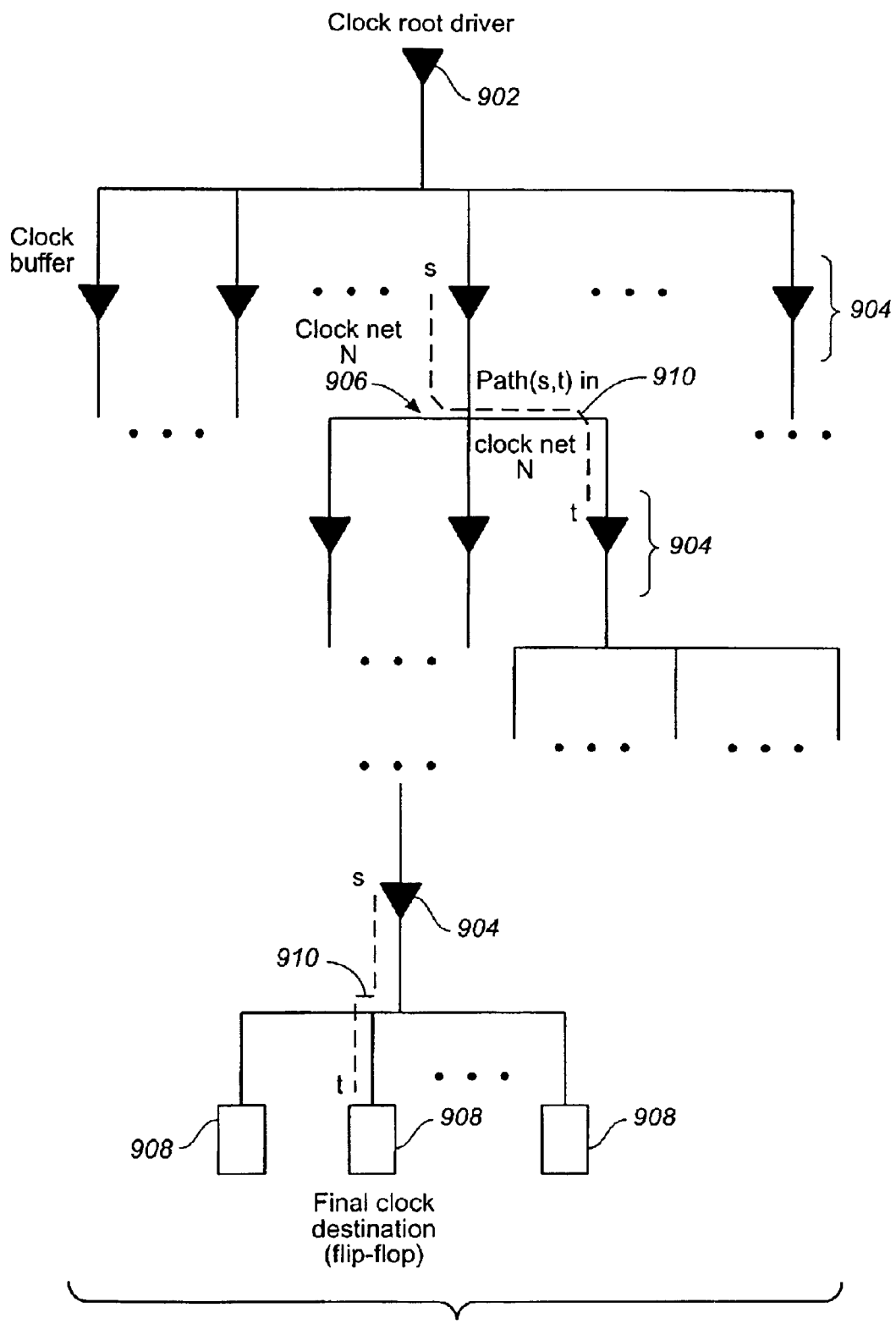
FIG._9A

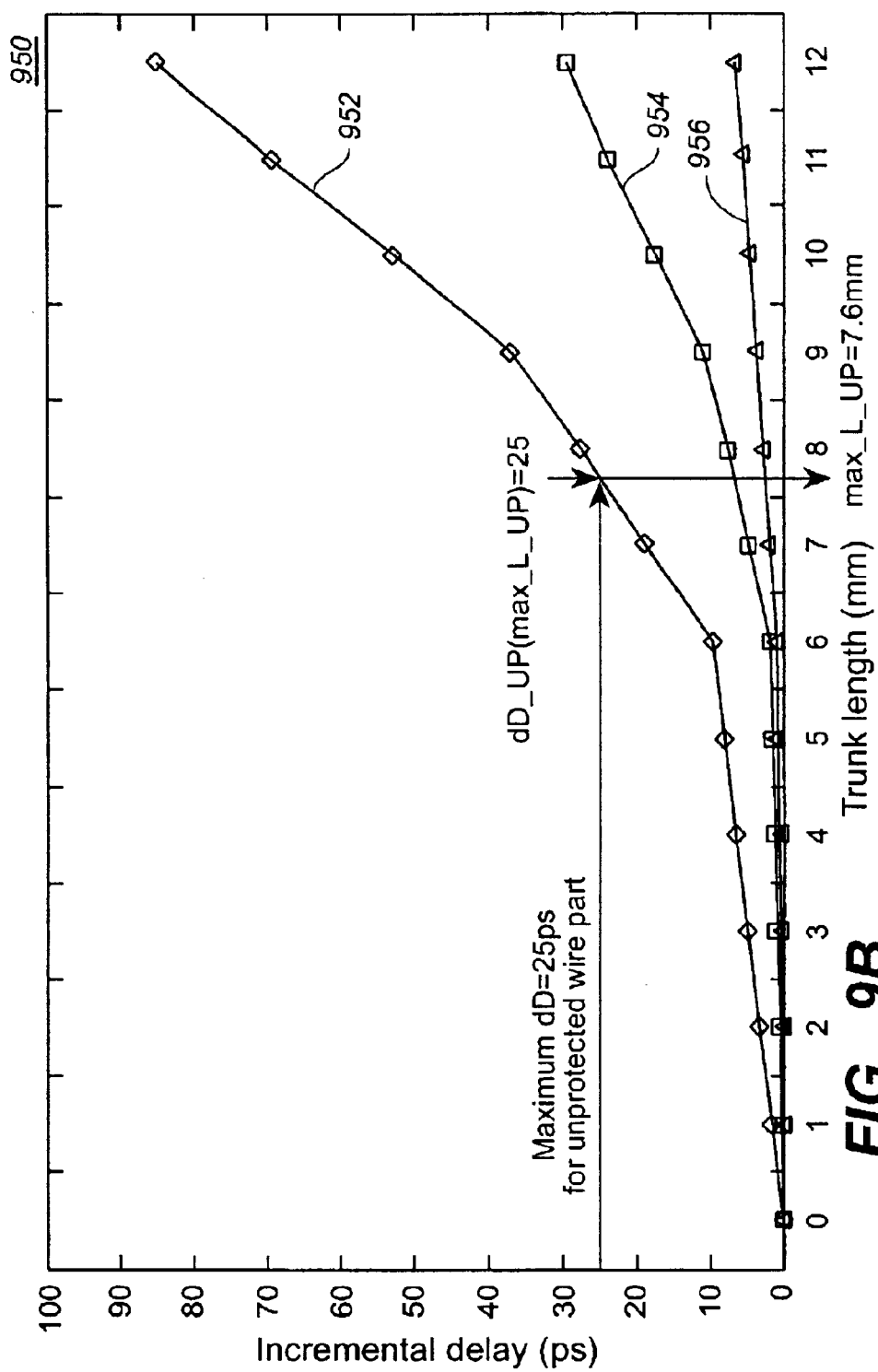

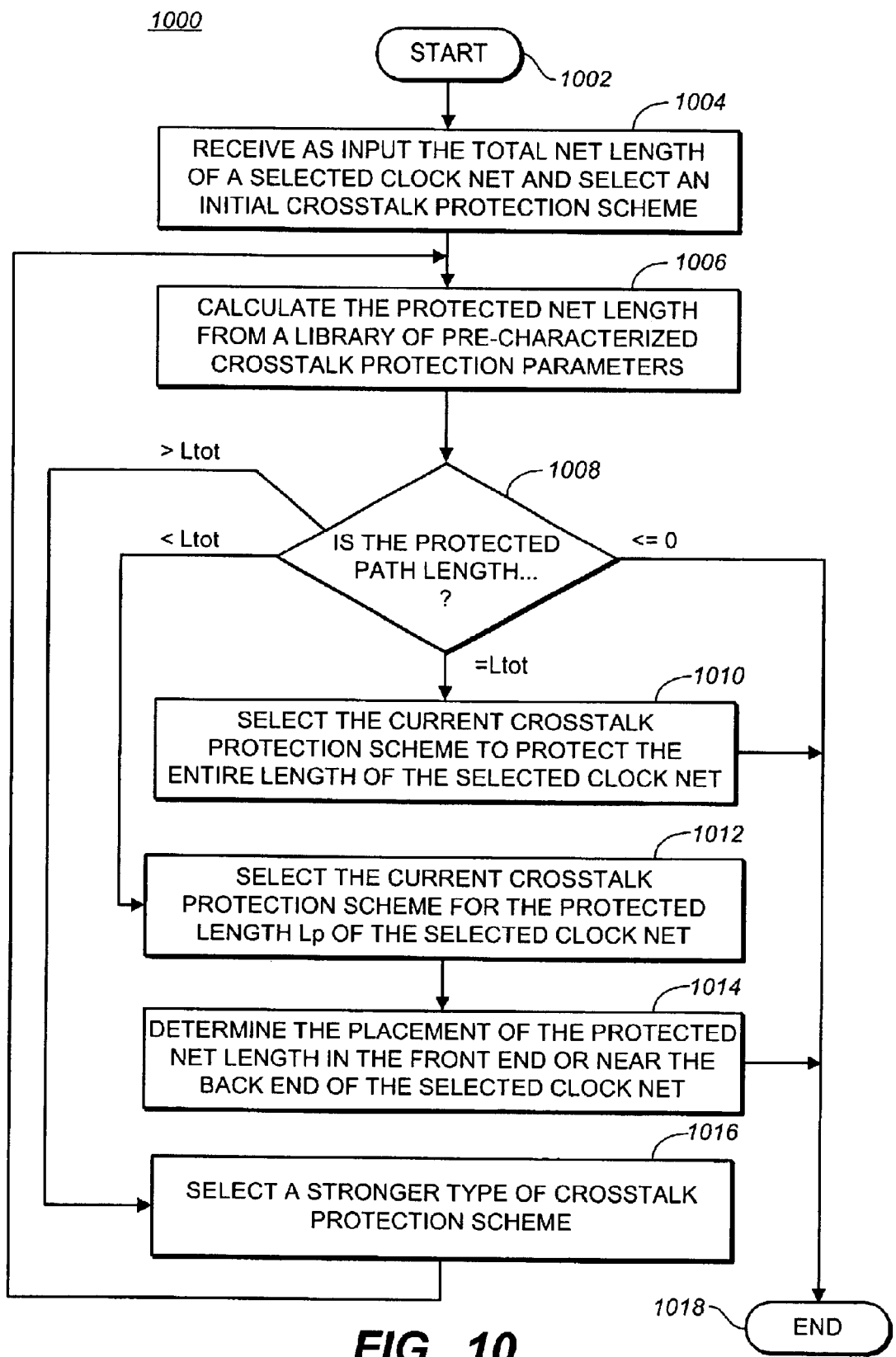
FIG._10

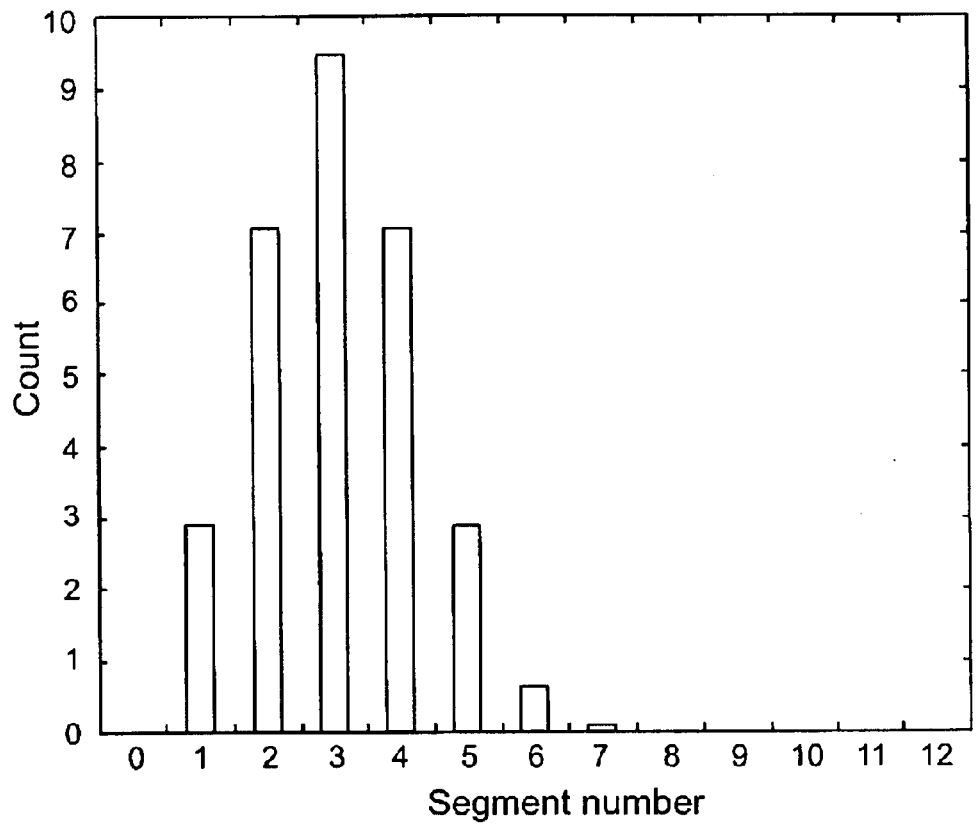
FIG._10A
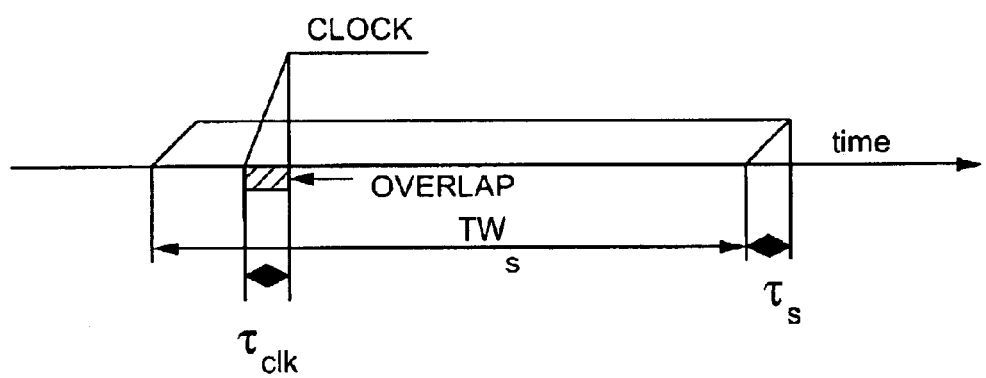
FIG._10B

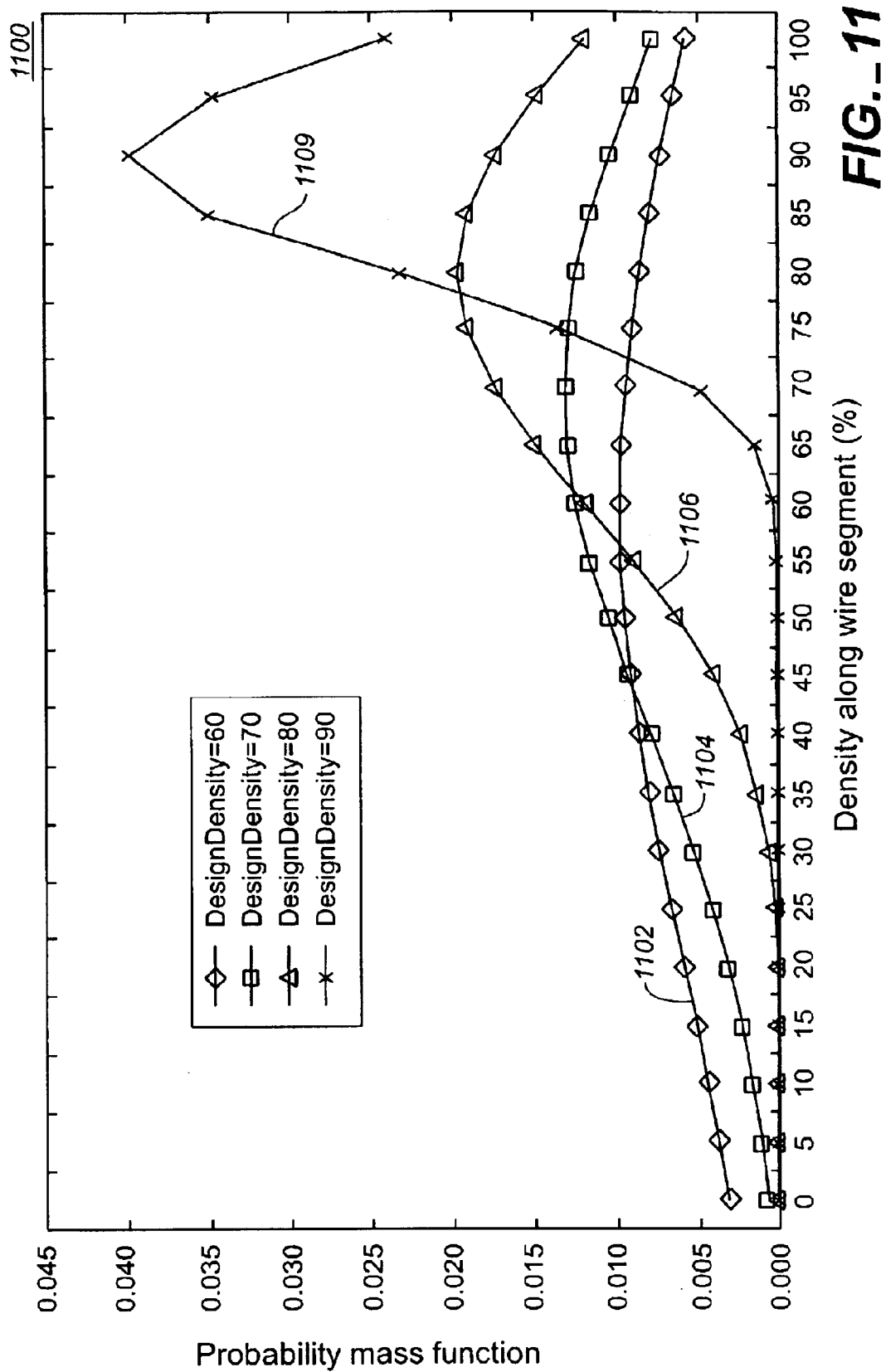
FIG._11

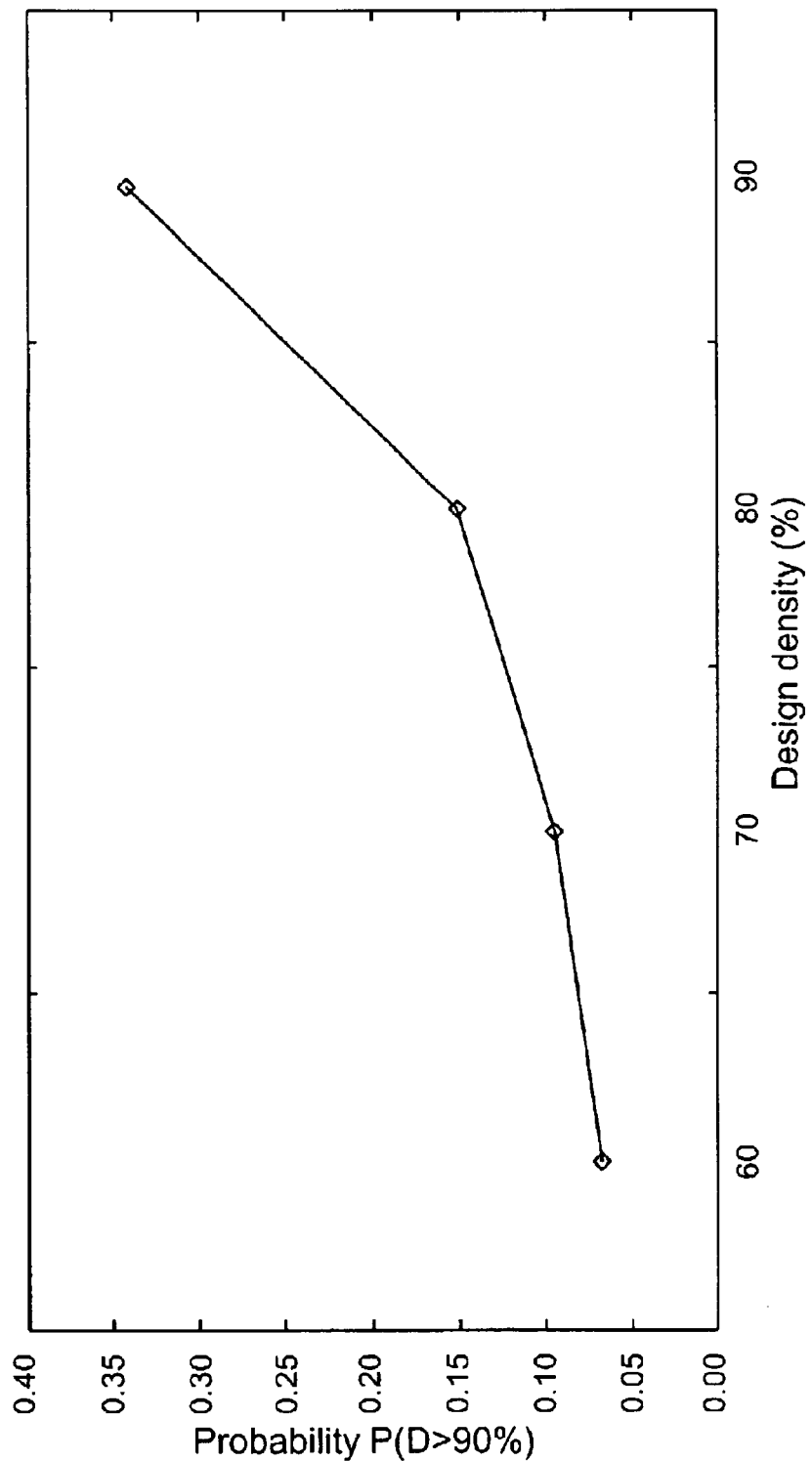
FIG._12A

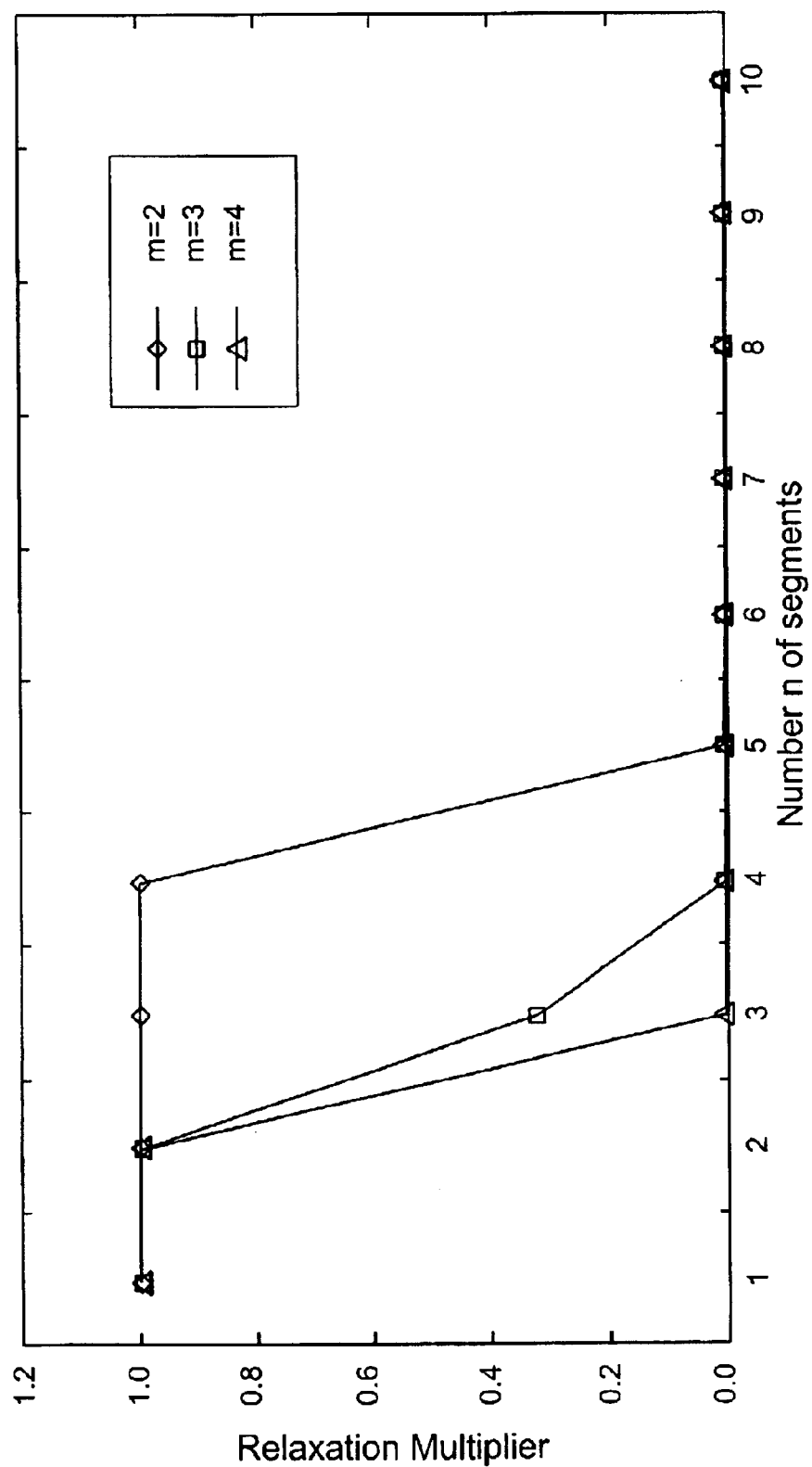
FIG._12B

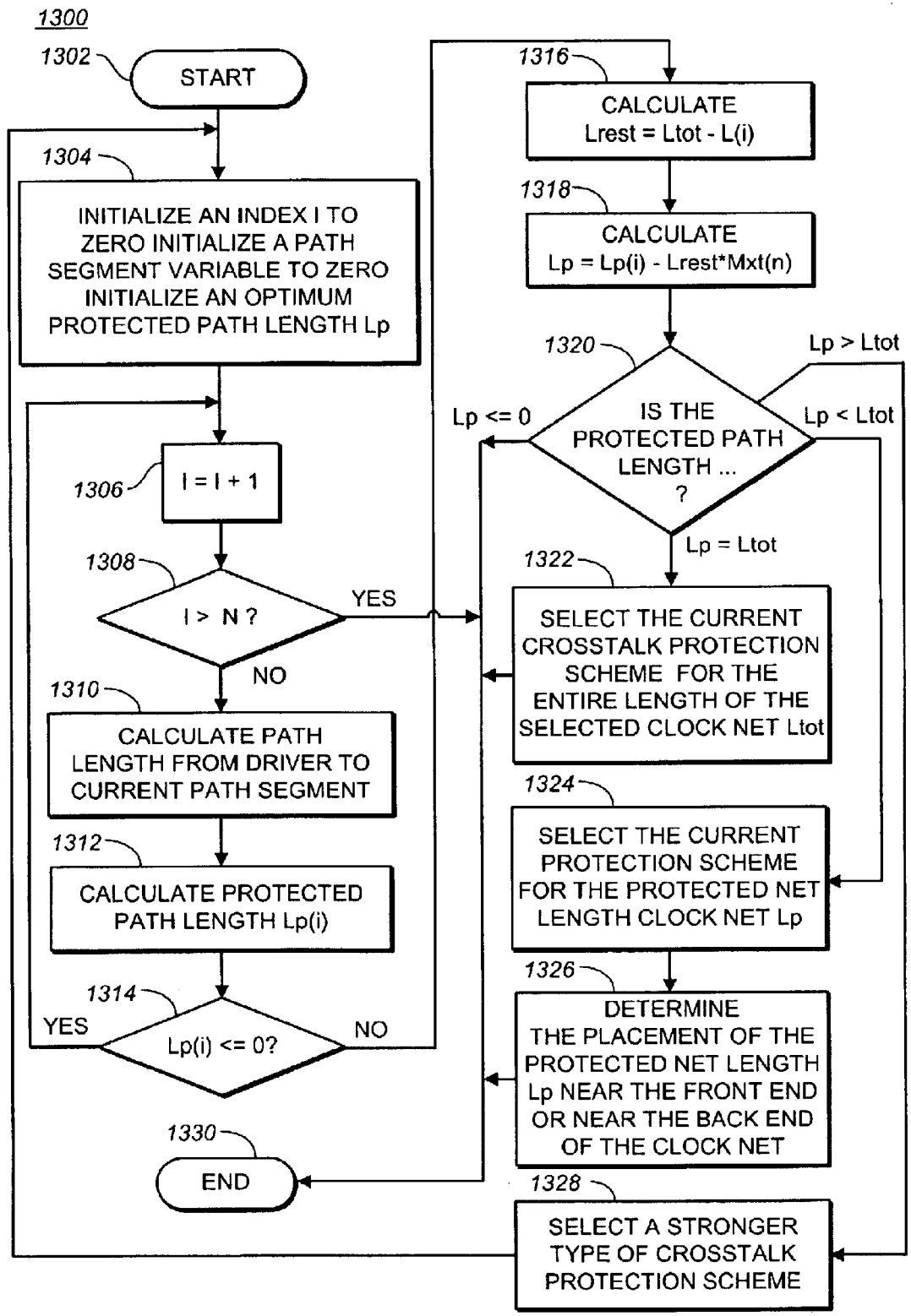
FIG._13

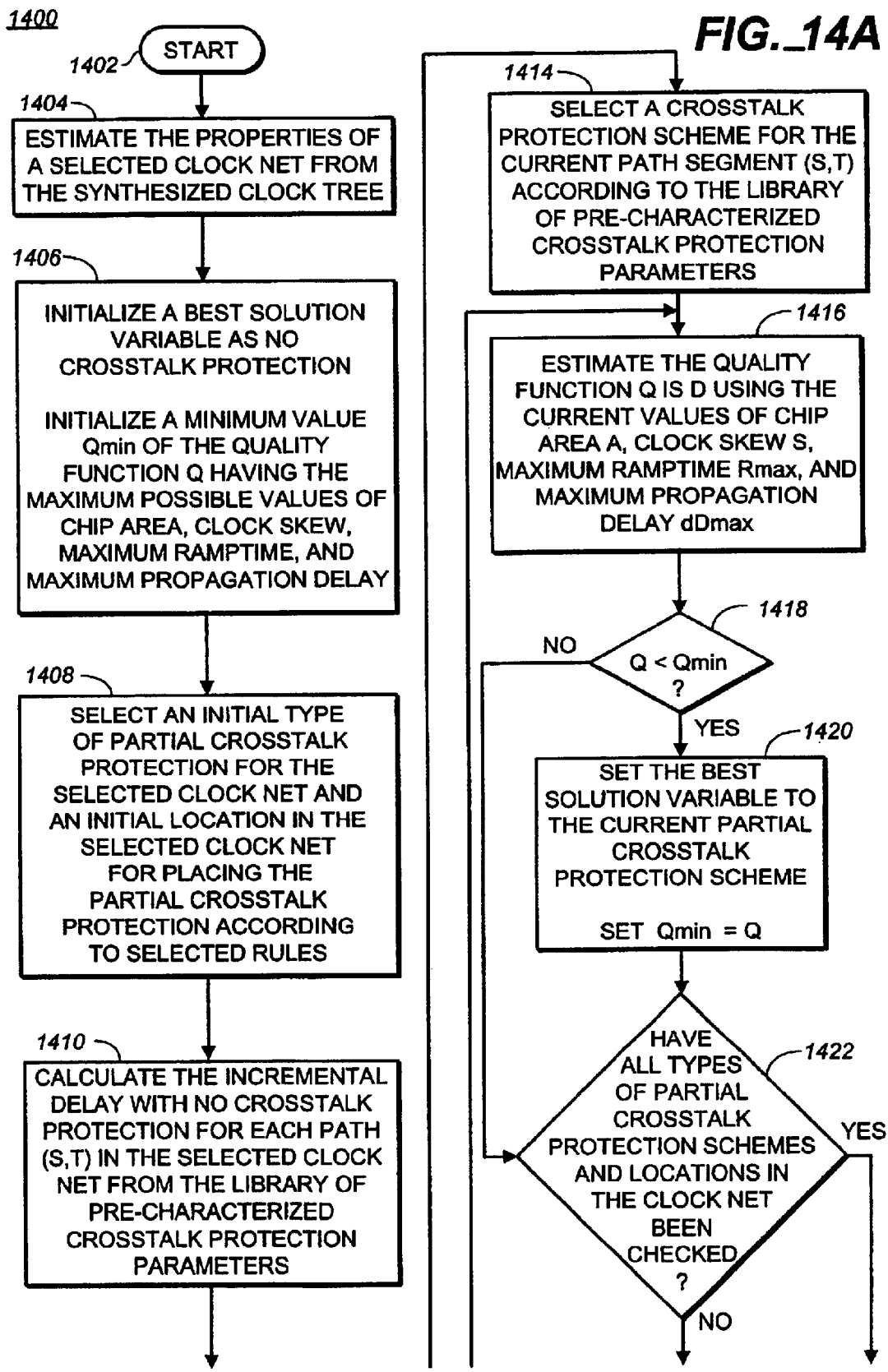
FIG._14A

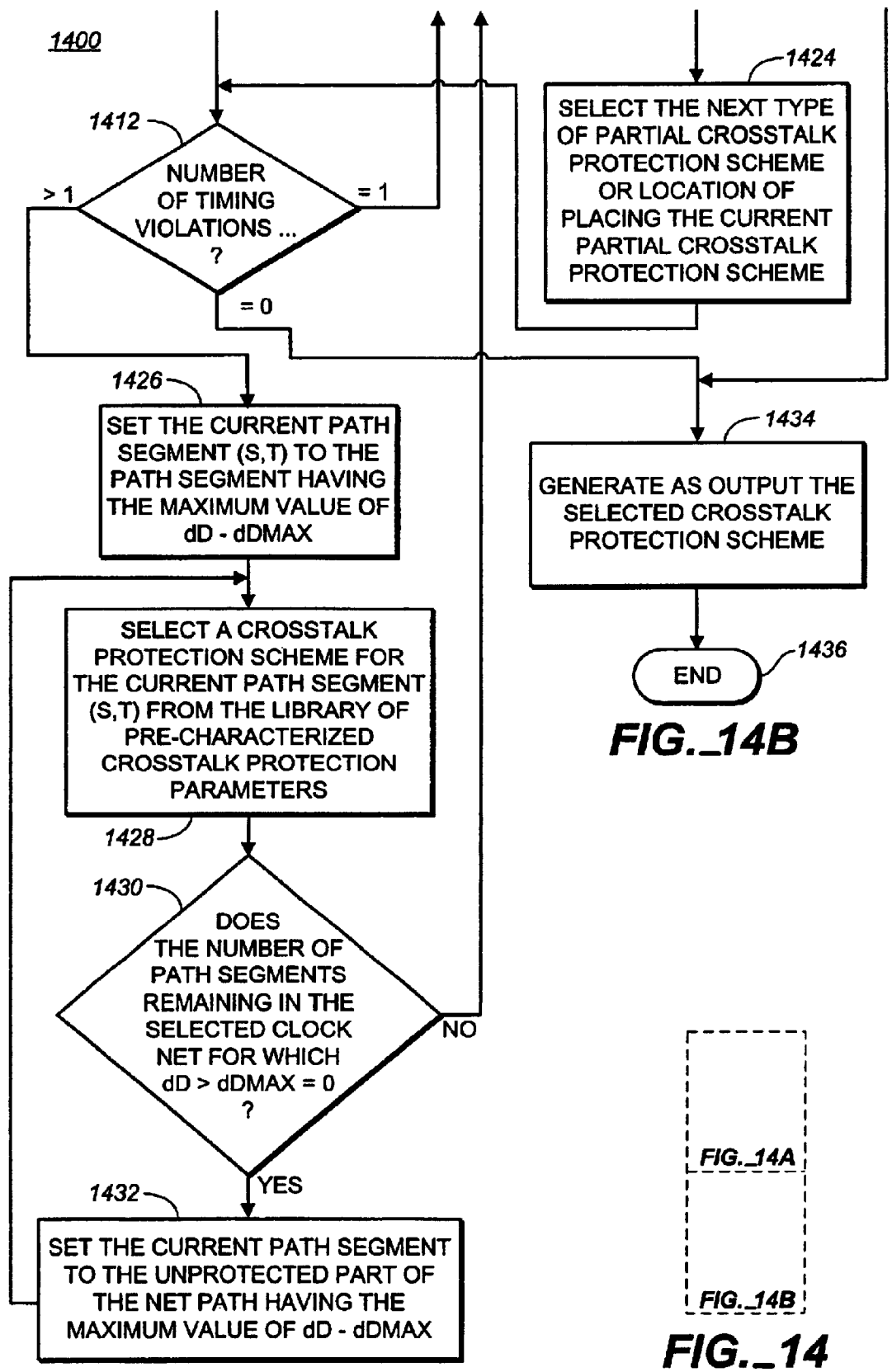
FIG._14

US 6,948,142 B2

INTELLIGENT ENGINE FOR PROTECTION AGAINST INJECTED CROSSTALK DELAY

BACKGROUND OF THE INVENTION

1. Field of the Invention

The present invention relates generally to the design of integrated circuits. More specifically, but without limitation thereto, the present invention relates to the routing of clock trees in an integrated circuit design to avoid injected crosstalk delay.

2. Description of the Prior Art

Clock signals are typically used in integrated circuit designs to control the timing of various functions performed by the integrated circuit. The clock signals are distributed to various locations in the integrated circuit by path structures called clock trees. The design and routing of clock trees in the integrated circuit design impacts all aspects of the integrated circuit design. Variations in arrival time of the clock signal may decrease performance of the integrated circuit and may even result in a functional failure due to a setup or hold time violation.

SUMMARY OF THE INVENTION

In one aspect of the present invention, a method of protecting a net of an integrated circuit against injected crosstalk delay includes steps of:

(a) receiving a synthesized signal path structure and a value of maximum allowable injected crosstalk delay for a selected net in the signal path structure;

(b) analyzing the signal path structure to calculate a skew correction and a net ramptime for the selected net;

(c) estimating an injected crosstalk delay of the selected net from a net aggressor; and (d) selecting a crosstalk protection scheme for the selected net to minimize chip area of the integrated circuit while ensuring that the injected crosstalk delay of the selected net does not exceed the value of maximum allowable injected crosstalk delay.

In another aspect of the present invention, a computer program product for optimizing a bond out design includes:

a medium for embodying a computer program for input to a computer; and a computer program embodied in the medium for causing the computer to perform steps of:

(a) receiving a synthesized signal path structure and a value of maximum allowable injected crosstalk delay for a selected net in the signal path structure;

(b) analyzing the signal path structure to calculate a skew correction and a net ramptime for the selected net;

(c) estimating an injected crosstalk delay of the selected net from a net aggressor; and (d) selecting a crosstalk protection scheme for the selected net to minimize chip area of the integrated circuit while ensuring that the injected crosstalk delay of the selected net does not exceed the value of maximum allowable injected crosstalk delay.

BRIEF DESCRIPTION OF THE DRAWINGS

The present invention is illustrated by way of example and not limitation in the accompanying figures, in which like references indicate similar elements throughout the several views of the drawings, and in which:

FIG. 1A illustrates an unprotected clock net of the prior art with minimal spacing between net aggressors;

FIG. 1B illustrates a typical plot of incremental injected crosstalk delay as a function of the clock net length;

FIG. 2 illustrates a grid spacing crosstalk protection scheme of the prior art;

FIG. 3 illustrates a metal shielding crosstalk protection scheme of the prior art;

FIG. 4 illustrates a partial grid spacing crosstalk protection scheme according to an embodiment of the present invention;

FIG. 5 illustrates a partial metal shielding crosstalk protection scheme according to an embodiment of the present invention;

FIG. 6 illustrates an alternative partial grid spacing crosstalk protection scheme according to an embodiment of the present invention;

FIG. 7 illustrates a mixed partial crosstalk protection scheme according to an embodiment of the present invention with both partial grid spacing and partial metal shielding;

FIG. 8 illustrates a flow chart of a method of protecting a net of an integrated circuit against injected crosstalk delay according to an embodiment of the present invention;

FIG. 9A illustrates a illustrates a typical clock tree of the prior art;

FIG. 9B illustrates a plot of incremental crosstalk delay for a specific technology using varius crosstalk protection schemes according to an embodiment of the present invention;

FIG. 10 illustrates a flow chart of a method of selecting an optimal partial protection scheme according to an embodiment of the present invention;

FIG. 10A illustrates a histogram of a typical distribution of clock nets having n path segments used to calculate the probability $Q_n$ according to an embodiment of the present invention;

FIG. 10B illustrates the geometrical probability of overlap between a clock transition and the timing window of a net aggressor according to an embodiment of the present invention;

FIG. 11 illustrates a plot of a probability mass function as a function of wire density along a path segment used to calculate $P_{D>90\%}$ according to an embodiment of the present invention;

FIG. 12A illustrates a plot of $P_{D>90\%}$ as a function of average design wire density calculated from FIG. 11;

FIG. 12B illustrates a plot of the relaxation crosstalk multiplier $M_{xt}(n)$ as a function of the number of path segments n in the selected clock net according to an embodiment of the present invention;

FIG. 13 illustrates a flow chart of a method of calculating an optimum protected path length for a selected clock net according to an embodiment of the present invention; and FIGS. 14A and 14B illustrates a flow chart for an intelligent engine according to an embodiment of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

One of the most significant factors that may affect the clock arrival time, or propagation delay, in a clock tree of an integrated circuit design is the crosstalk generated from signals carried in wires adjacent to the clock net. The crosstalk may inject an incremental crosstalk delay (positive or negative) in a clock net. In previous design flows, the clock tree implementation is designed and a crosstalk analysis is performed afterward to determine whether the crosstalk results in any timing violations in the clock net. If timing violations are found, the clock tree design is modified, and another crosstalk analysis is performed. This cycle is iterated until all timing violations are removed, which may be an extremely time-consuming process.

An intelligent engine for protection against injected crosstalk delay of the present invention anticipates timing violations injected by crosstalk signals so that the clock tree design may be completed in a single pass without requiring a crosstalk analysis. Cross-talk analysis may be an extremely time-consuming task in itself. Although a clock tree is used herein to illustrate an example of how an intelligent engine for protection against injected crosstalk delay of the present invention may be used, other signal path structures may be used to practice the present invention within the scope of the appended claims.

In one aspect of the present invention, a method of protecting a net of an integrated circuit against injected crosstalk delay includes steps of: (a) receiving a synthesized signal path structure and a value of maximum allowable injected crosstalk delay for a selected net in the signal path structure; (b) analyzing the signal path structure to calculate a skew correction and a net ramptime for the selected net; (c) estimating an injected crosstalk delay of the selected net from a net aggressor; and (d) selecting a crosstalk protection scheme for the selected net to minimize chip area of the integrated circuit while ensuring that the injected crosstalk delay of the selected net does not exceed the value of maximum allowable injected crosstalk delay.

One approach to ensuring adequate protection against injected crosstalk in a clock tree or other signal path structure is to provide a spacing or a shield around the clock net after constructing the clock tree. However, this approach may require a significant amount of chip area in the integrated circuit design and may not be necessary for all the clock nets of the clock tree in terms of providing adequate protection. For example, shorter nets of the clock tree may not be subject to levels of injected crosstalk delay that exceed the maximum allowable injected crosstalk delay value of the shorter nets. Because there may be several hundred thousand flip-flops and associated wiring in a clock tree, the chip area required to provide complete protection for the entire clock tree may require a chip area that is relatively large compared to the chip area required to perform the functions of the integrated circuit design.

In a method of protecting a net of an integrated circuit against injected crosstalk delay of the present invention, adequate clock protection against injected crosstalk delay is provided while advantageously minimizing the chip area of the integrated circuit. Also, clock skew is reduced and ramptime is improved for long nets. The minimization of chip area, reduction of clock skew, and improved ramptime for long nets is achieved by an intelligent engine that determines the amount of protection required for each clock net in the clock tree to ensure that the injected crosstalk delay in each net does not exceed a maximum allowable injected crosstalk delay value in the integrated circuit design. By affording the needed amount of partial protection for each clock net, the design goals of the integrated circuit may be satisfied while minimizing the chip area. The intelligent engine of the present invention may be incorporated, for example, into software tools used in commercially available integrated circuit design platforms.

Crosstalk delay is injected into a clock net from adjacent wires in other signal nets, called net aggressors. Depending on the waveform of the signal in the net aggressors, the injected crosstalk delay may be either positive or negative. Various protection schemes for avoiding injected crosstalk delay are described as follows.

FIG. 1A illustrates an unprotected clock net of the prior art with minimal spacing between net aggressors. Shown in FIG. 1A are a clock net 102 having three net segments 104, 106 and 108, a routing grid 110, net aggressors 112 and 114, a clock buffer 116, and a clock destination 118.

In FIG. 1A, the clock net 102 extends from the clock buffer 116 to the clock destination 118 along the three net segments 104, 106 and 108 that follow the routing grid 110. Each change in direction of the clock net 102 from vertical to horizontal or the reverse defines a new net segment. In this example, there are three net segments.

The net aggressors 112 and 114 are routed along the nearest available grid lines next to the clock net 102. While this arrangement results in minimum chip area, it also results in maximum injected crosstalk delay, which may result in setup time or hold timing violations. The value of injected crosstalk delay above which timing violations may occur in a selected clock net is referred to herein as the maximum allowable injected crosstalk delay value. Because the timing violations may result in a malfunction of the integrated circuit, a crosstalk analysis generally performed to detect timing violations. If a timing violation is found, the clock net routing is re-routed and another crosstalk analysis is performed, and so on, until a routing of the clock net is found that does not result in a timing violation. In some cases, no solution may be found, and an even more time-consuming circuit re-design must be performed.

FIG. 1B illustrates a typical plot of incremental injected crosstalk delay as a function of the clock net length. Shown in FIG. 1B are a plot 152 for an unprotected clock net, a plot 154 for a clock net with one additional grid spacing, and a plot 154 for a shielded clock net. In this example, the incremental crosstalk delay dD is equal to 25 picoseconds when the length of an unprotected clock net reaches 1.05 millimeters. At a net length of about 2 millimeters, the shielded clock net has an incremental delay of about 15 picoseconds, the clock net with grid spacing has an incremental delay of about 55 picoseconds, and the unprotected clock net has an incremental delay of about 145 picoseconds. Plots such as that illustrated in FIG. 1B may be generated from empirical data and used to construct a library of pre-characterized crosstalk protection parameters.

FIG. 2 illustrates a grid spacing crosstalk protection scheme of the prior art. Shown in FIG. 2 are a clock net 102 having three net segments 104, 106 and 108, a routing grid 110, net aggressors 112 and 114, a clock buffer 116, and a clock destination 118.

In FIG. 2, the clock net 102 is spaced apart from the net aggressors 112 and 114 by one grid unit spacing $\Delta_S$. The spacing $\Delta_S$ between the clock net 102 and the net aggressor nets 112 and 114 may also be multiples of a grid unit. While this arrangement reduces injected crosstalk delay in the clock net 102 from the net aggressors 112 and 114, the chip area is increased significantly.

FIG. 3 illustrates a metal shielding crosstalk protection scheme of the prior art. Shown in FIG. 3 are a clock net 102 having three net segments 104, 106 and 108, a routing grid 110, net aggressors 112 and 114, a clock buffer 116, a clock destination 118, a power wire 120, and a ground wire 122.

In FIG. 3, the power wire 120 and the ground wire 122 provide a low-impedance path to ground for the crosstalk emitted from the net aggressors 112 and 114. This arrangement provides even greater attenuation of injected crosstalk in the clock net 102 than the grid spacing protection scheme of FIG. 2 for the same increase in chip area, however, the capacitance between the clock net and the power wire 120 and between the clock net 102 and the ground wire 122 results in increased clock skew and ramptime.

FIG. 4 illustrates a partial grid spacing crosstalk protection scheme according to an embodiment of the present invention. Shown in FIG. 4 are a clock net 102 having three net segments 104, 106 and 108, a routing grid 110, net aggressors 112 and 114, a clock buffer 116, and a clock destination 118.

In FIG. 4, the clock net 102 is partially protected by a length $L_p$ of the total length $L_{tot}$ of the first net segment 104 of the clock net 102, while the remaining length $L_{up}$ of the total length $L_{tot}$ including net segments 106 and 108 of the clock net 102 is unprotected. The degree of protection may be adjusted by adjusting the protected length $L_p$ of the clock net 102.

FIG. 5 illustrates a partial metal shielding crosstalk protection scheme according to an embodiment of the present invention. Shown in FIG. 5 are a clock net 102 having three net segments 104, 106 and 108, a routing grid 110, net aggressors 112 and 114, a clock buffer 116, a clock destination 118, a power wire 120, and a ground wire 122.

In FIG. 5, the clock net 102 is partially protected by a length $L_p$ of the total length $L_{tot}$ of the first net segment 104 of the clock net 102, while the remaining length $L_{up}$ of the total length $L_{tot}$ of the clock net 102 including net segments 106 and 108 is unprotected. The degree of protection may be adjusted by adjusting the protected length $L_p$ of the clock net 102. By only using the degree of protection required to satisfy the maximum allowable injected crosstalk delay for the clock net 102, the increase in clock skew and ramptime may be minimized.

FIG. 6 illustrates an alternative partial grid spacing crosstalk protection scheme according to an embodiment of the present invention. Shown in FIG. 6 are a clock net 102 having three net segments 104, 106 and 108, a routing grid 110, net aggressors 112 and 114, a clock buffer 116, and a clock destination 118.

In FIG. 6, the clock net 102 is partially protected by a length $L_p$ of the total length $L_{tot}$ of the last net segment 108 of the clock net 102. In the same manner, the protected length $L_p$ may be placed in the middle net segment 106. By placing the protected length $L_p$ in the net segment or segments where the greatest amount of injected crosstalk delay may occur, the amount of protection required for the clock net 102 may be significantly reduced without exceeding the maximum allowable injected crosstalk delay.

FIG. 7 illustrates a mixed partial crosstalk protection scheme according to an embodiment of the present invention with both partial grid spacing and partial metal shielding. Shown in FIG. 7 are a clock net 102 having three net segments 104, 106 and 108, a routing grid 110, net aggressors 112 and 114, a clock buffer 116, a clock destination 118, a power wire 120, and a ground wire 122.

In FIG. 7, metal shielding is used over a length $L_m$ in the first segment 104 of the clock net 102, and grid spacing protection is used over a length $L_s$ in the last segment 108 of the clock net 102.

In a general partial crosstalk protection scheme according to an embodiment of the present invention, each net segment or portion of a net segment of the clock net 102 may be unprotected or protected by one of the types of partial crosstalk protection schemes described with reference to FIGS. 4–7.

The problem of finding the optimum partial crosstalk protection is a complex one. For example, more crosstalk protection requires more chip area, improved crosstalk protection using metal shielding increases net capacitance that results in greater ramptime, and so on.

In one aspect of the present invention, a method of protecting a net of an integrated circuit against injected crosstalk delay includes steps of: (a) receiving a synthesized signal path structure and a value of maximum allowable injected crosstalk delay for a selected net in the signal path structure; (b) analyzing the signal path structure to calculate a skew correction and a net ramptime for the selected net; (c) estimating an injected crosstalk delay of the selected net from a net aggressor; and (d) selecting a crosstalk protection scheme for the selected net to minimize chip area of the integrated circuit while ensuring that the injected crosstalk delay of the selected net does not exceed the value of maximum allowable injected crosstalk delay.

Given a design for a clock tree or other signal path structure and the maximum allowable injected crosstalk delay value for each clock net in the clock tree or net in the signal path structure, optimum partial crosstalk protection may be found to satisfy the following conditions:

(1) the injected crosstalk delay for any clock net under worst case conditions does not exceed the maximum allowable injected crosstalk delay;

(2) the chip area required to provide the partial crosstalk protection is a minimum;

(3) the partial crosstalk protection decreases the amount of clock skew correction required; and (4) signal ramptime is improved in the longest clock nets of the clock tree.

The worst case conditions include the combination of net aggressors and signal switching within the net aggressors, however, the worst case conditions may be limited to those that may occur in the clock net during approximately two years of functioning to avoid increasing the chip cost unnecessarily. The worst case conditions for a selected clock net may then be expressed as a function of the number of net segments, the net length, and the net aggressor.

FIG. 8 illustrates a flow chart 800 of a method of protecting a net of an integrated circuit against injected crosstalk delay according to an embodiment of the present invention.

Step 802 is the entry point of the flow chart 800.

In step 804, a clock tree synthesized according to well-known techniques is received as input along with a maximum allowable injected crosstalk delay for each net in the clock tree.

In step 806, the clock tree is analyzed. The functions of the clock tree analyzer are described below in detail.

In step 808, a first clock net in the clock tree is selected.

In step 810, an optimum crosstalk protection scheme for the selected clock net is selected from a library of pre-characterized crosstalk protection parameters according to the clock tree analysis. The library of pre-characterized crosstalk protection parameters and the selection process are described below in detail.

In step 812, if an optimum crosstalk protection scheme for every clock net in the clock tree has been selected, control is transferred to step 816, otherwise control is transferred to step 814.

In step 814, the next clock net in the clock tree is selected, and control is transferred to step 810.

Step 816 is the exit point of the flow chart 800.

For each selected clock net in the clock tree, the clock analyzer calculates a clock skew correction, a clock net length, a clock net wire segment number, a clock net fanout, and an estimate of clock net ramptime as follows.

FIG. 9A illustrates a typical clock tree 900 of the prior art. Shown in FIG. 9A are a clock root driver 902, clock buffers 904, a clock net 906, clock destination flip-flops 908, and path segments (s, t) 910.

The clock tree 900 may be synthesized according to well-known techniques and received as input as described in step 802. The clock root driver 902 buffers the clock signal to the top level of clock buffers 904 in the clock tree 900. The clock net 906 includes a set of path segments (s, t) 910 between each level of clock buffers 904 from the top level down to one of the destination flip-flops 908. In the set of path segments (s, t) 910, each output of a clock buffer 904 is represented by s. The corresponding input of the clock buffer 904 on the next lower level to which the output of the clock buffer 904 on the higher level is connected is represented by t.

The synthesized clock tree is received as input and is analyzed by a clock tree analyzer as follows. The clock skew correction dS(s, t) is defined as the desired change in clock delay for each path segment (s, t). If dS(s, t) is equal to zero, then no correction is desired or needed. If dS(s, t) is greater than zero, then increasing the delay in the corresponding path segment (s, t) by dS(s, t) is desirable. If dS(s, t) is less than zero, then decreasing the delay in the corresponding path segment (s, t) by dS(s, t) is desirable. If dS(s, t) is equal to an interval [dS1, dS2], then the interval [dS1, dS2] defines the range of tolerance to injected crosstalk delay. The higher the range of dS(s, t), the less crosstalk protection is needed for the corresponding clock net 906.

The clock skew S is the maximum difference in clock arrival time between the clock root driver 902 in FIG. 9A and each of the destination flip-flops 908, that is, $S=D_{max}-D_{min}$, where $D_{max}$ is the maximum clock delay from the clock root driver 902 to a destination flip-flop 908 in the path $P_{max}$, and $D_{min}$ is the minimum clock delay from the clock root driver 902 to a destination flip-flop 908 in the path $P_{min}$. Each path P has a corresponding propagation delay $D_P$, where $D_{min} \leq D_P \leq D_{max}$. The paths $P_{max}$ and $P_{min}$ are the most sensitive to injected crosstalk delay, because these paths are on the boundaries of the range of values of the clock skew S and are therefore most likely to increase the range of values for the propagation delays $D_P$. The other paths P are less sensitive to injected crosstalk delay, because a change in the corresponding propagation delay $D_P$ is less likely to alter the clock skew S and the functionality of the integrated circuit design.

If a clock net path (s, t) belongs to the path P, and if P is not $P_{max}$ or $P_{min}$, then small changes in the propagation delay D(s, t) that may result from a crosstalk protection scheme may calculated as a difference $D_{min}-D_P$ and a difference $D_{max}-D_P$ along the path segment (s, t) will not alter the clock skew S. Accordingly, dS(s, t) may be set equal to a range of possible changes as follows:

$$dS(s,t)=[k(D_{min}-D_P), k(D_{max}-D_P)] \quad (1)$$

where $k=D(s, t)/D_P$. As a result, the range $[(D_{min}-D_P), (D_{max}-D_P)]$ for the path segments (s, t) in the path P is distributed proportionally in the propagation delay D(s, t). If the delay in the path segment (s, t) is decreased by less than $-k(D_{min}-D_P)$, then $D_{min}$ is unchanged, and if the delay in the path segment (s, t) is increased by less than $k(D_{max}-D_P)$, then $D_{max}$ is unchanged. The greater the range of dS(s, t), the less crosstalk protection is needed for the clock net 906.

If any path segment (s, t) belongs to both paths $P_{max}$ and $P_{min}$, then any change in the delay along the path segment (s, t) will not alter the clock skew S. Accordingly, no delay correction is needed, and dS(s, t) may be set equal to zero.

A clock net length L(s, t) for each path segment (s, t) is calculated according to well-known techniques.

A wire segment number N(s, t) for each path segment (s, t) in the clock net 906 is assigned according to well-known techniques. For example, a clock net with three path segments (s, t) may be assigned wire segment numbers 1, 2 and 3.

The clock net fanout is equal to the number of clock destination flip-flops 908. The signal ramptime of each clock net at each corresponding clock destination flip-flop 908 is estimated according to well-known techniques as a function of net resistance, total capacitance, and clock buffer drive capability.

The library of pre-characterized crosstalk protection parameters in step 808 is constructed as follows. For each crosstalk protection scheme described in FIGS. 2–7, the following function of incremental crosstalk delay is generated by simulation:

$$dD=F(L_{tot}, T, B, M, prot) \quad (2)$$

where $L_{tot}$ is equal to the path segment length L(s, t), T is representative of the packaging technology, B is the clock driver strength, M is the metal layer (for example, the metal layer may be M2 or M5), and prot is the type of crosstalk protection scheme. The simulation of each crosstalk protection scheme is performed according to well-known techniques for a fanout equal to one under worst case conditions, that is, the clock net is surrounded by the strongest net aggressors, and all net aggressors switch simultaneously in the same direction. For example, the crosstalk protection scheme may be 1-grid additional spacing, 2-grid additional spacing, or metal shielding. The incremental crosstalk delay dD defined in equation (2) may be conservatively approximated by:

$$dD=\alpha * L_{tot} \quad (3)$$

where a is equal to a constant evaluated for each set of variables {T,B,M,prot} for a fanout equal to one. By storing the set of constants $$\alpha=\{\alpha(T,B,M,prot)\} \quad (4)$$

in a library of pre-characterized crosstalk protection parameters for each unprotected and protected clock net wiring scheme, the incremental crosstalk delay dD may be calculated for each path segment (s, t) in a clock net having a total length $L_{tot}$ from the appropriate crosstalk protection parameters.

The incremental crosstalk delay dD for a path segment (s, t) having a total length $L_{tot}$ for a given packaging technology, metal layer, and a partial crosstalk protection scheme may be calculated from the library of pre-characterized crosstalk protection parameters as follows. The total length $L_{tot}$ includes a partially protected length $L_p \leq L_{tot}$ and an unprotected length $L_{up}=L_{tot}-L_p$. The following linear functions may be calculated from equation (3):

$$dD_{up}=\alpha_{up} * L_{tot} \quad (5)$$

$$dD_p=\alpha_p * L_{tot} \quad (6)$$

where $a_p$ and $a_{up}$ are constants from the library of pre-characterized crosstalk protection parameters for unprotected and protected clock nets, respectively, $dD_{up}$ and $dD_p$ is used for all protected delay incremental delays. The incremental delay dD in a clock net having partial protection may be calculated as follows from equation (7):

$$dD = dD_p(L_p) + dD_{up}(L_{up}) = dD_p(L_p) + dD_{up}(L_{tot} - L_p) \quad (7)$$

Substituting the linear equations (5) and (6) into equation (7) yields equation (8):

$$dD = a_p * L_p + a_{up} * (L_{tot} - L_p) \quad (8)$$
$$= (a_p - a_{up}) * L_p + a_{up} * L_{tot}$$

FIG. 9B illustrates a plot 950 of incremental crosstalk delay for a specific technology using various crosstalk protection schemes according to an embodiment of the present invention. Shown in FIG. 9B are an incremental crosstalk curve 952 with minimum grid spacing (no crosstalk protection), an incremental crosstalk curve 954 with 1-grid spacing crosstalk protection, and an incremental crosstalk curve 956 with metal shielding crosstalk protection. As shown in the plot 950, using a metal shielding crosstalk protection scheme results in the minimum incremental crosstalk delay dD for increasing values of the clock net length.

An intelligent engine selects an optimum protection scheme for the selected clock net against injected crosstalk delay according to the clock tree analysis by determining how adequate partial crosstalk protection may be provided using minimum chip area while taking into consideration clock skew and ramptime, and further minimizing chip area by taking into account possible reduction in protection where the clock net has many net aggressors, that is, where the probability of simultaneous switching by all the net aggressors is reduced.

In the following example, a clock net having a fanout of one with a driver s and a receiver t is selected using an additional 1-grid protection scheme selected from the library of pre-characterized crosstalk protection parameters. Also, possible changes in the clock propagation delay, or clock skew, are ignored, the possible effect of implementing partial protection in the front end or the back end of the clock net on dD is ignored, and possible changes in the clock ramptime are ignored. A protected length $L_p \leq L$ is desired such that the limitation on the incremental crosstalk delay dD given by $$dD = dD_{max} \quad (9)$$

is satisfied, where $dD_{max}$ is the maximum allowed incremental crosstalk delay, for example, 25 picoseconds. Also, the minimum chip area required for protection is desired, which means minimizing the protected length $L_p$.

For $dD = dD_{max}$, the protected length $L_p$ may be found by rearranging equation (8):

$$L_p = (dD_{max} - a_{up} * L_{tot})/(a_p - a_{up}) \quad (10)$$

Depending on the value of the total net length $L_{tot}$, there are three possible solutions for the protected net length $L_p$. If $L_p > L_{tot}$, then protecting the entire net will be insufficient to satisfy the limitation on the maximum allowable crosstalk delay $dD_{max}$. In this case, a stronger crosstalk protection scheme may be attempted, for example, greater grid spacing or metal shielding. If $0 > L_p \leq L_{tot}$ then partial protection of the clock net may be used. Additional information may be used to decide whether the best place to implement this protection is in the front end or the back end of the clock net. For example, if the clock protection is additional grid spacing, and if the propagation delay would be improved by a decreasing the value of dS(s, t), then the net protection should be implemented in the front end of the clock net, because capacitance at the front end of the clock net is less than capacitance at the back end of the clock net, and reducing front end capacitance has a greater effect on incremental delay than does reducing back end capacitance. If metal shielding is used, then the net protection should be placed in the back end of the net, because increasing capacitance at the back end of the clock net has less effect on incremental delay than does increasing back end capacitance. If $L_p \leq 0$, no net protection is needed.

FIG. 10 illustrates a flow chart 1000 of a method of selecting an optimal partial protection scheme according to an embodiment of the present invention.

Step 1002 is the entry point of the flow chart 1000.

In step 1004, the total net length $L_{tot}$ of a selected clock net is received as input and an initial crosstalk protection scheme is selected, for example, additional 1-grid spacing.

In step 1006, the protected net length $L_p$ is calculated from the library of pre-characterized crosstalk protection parameters according to equation (10).

In step 1008, if $L_p \leq 0$, then no protection is needed for the selected clock net, and control is transferred to step 1018; else if $L_p = L_{tot}$, then control is transferred to step 1010; else if $L_p < L_{tot}$, then control is transferred to step 1012; else if $L_p > L_{tot}$, then control is transferred to step 1016.

In step 1010, the current crosstalk protection scheme is selected to protect the entire length of the selected clock net, and control is transferred to step 1018.

In step 1012, the current protection scheme is selected for the protected net length $L_p$ of the clock net.

In step 1014, the placement of the protected net length $L_p$ in the front end, near the clock driver s, or near the back end, near the receiver t, of the selected clock net is determined as described above, and control is transferred to step 1018.

In step 1016, a stronger type of crosstalk protection scheme is selected, and control is transferred to step 1006.

Step 1018 is the exit point of the flow chart 1000.

The protected net length $L_p$ and the corresponding required chip area may be advantageously reduced by taking into account stochastic properties that affect the probability of the worst case crosstalk incremental delay in a selected clock net. When the selected clock net includes a number n of several path segments between the driver s and the receiver t as shown in FIG. 1, then for some larger n'>n, it is reasonable to decrease the amount of crosstalk protection based on the small probability of certain crosstalk events.

For a clock net (s, t) having n linear path segments, the number of net aggressors N may be expressed as:

$$N = f(n) = m * n \quad (11)$$

where m is the average number of net aggressors in a single linear path segment. In the worst case scenario, m=2, that is, there is a net aggressor on both sides of every path segment. Alternatively, a more complex model may be used, for example, m=m(L), where L is the path segment length, in which there may be more than an average of two net aggressors for every path segment. The function m(L) may be approximated by rL, where r is a constant. For example, a value of five may be used for r, if L is in millimeters.

The crosstalk incremental delay dD in the selected clock net may be modeled as dD=F(N), where the function F(N)

is a non-increasing function of N. Initially, that is, for small values of N, dD has a nearly constant value, then at some point, dD decreases for increasing values of N:

$$dD=dD(2) \text{ if } M_{xt} \geq 1 \quad (12)$$

$$dD=dD(2)*M_{xt} \text{ if } M_{xt}<1$$

where dD(2) is the incremental crosstalk delay dD in the selected clock net for one linear path segment and two net aggressors, which is the worst case simulation used to calculate the values in the library of pre-characterized crosstalk protection parameters. The values of the incremental crosstalk delay dD are therefore available for all net protection lengths Lp, and dD may have different values for an unprotected net, a net protected by grid spacing, and a net protected by metal shielding.

$M_{xt}$ is the mathematical expectation of the number of crosstalk risk situations in all clock nets of the clock tree in a selected period equal to TIME. For example, $M_{xt}$ may be equivalent to one crosstalk failure for a value of TIME equal to $72 \times 10^6$ seconds, which is the industry standard used equivalent to 2.28 years. The mathematical expectation $M_{xt}$ may be calculated as follows:

$$M_{xt}=M^{(1)}M^{(2)} \quad (13)$$

where $M^{(1)}$ is the mathematical expectation of the number of clock nets with n linear path segments (N is equal to m*n net aggressors) having a transition overlapping the timing windows of all net aggressors, that is, the clock signal changes state at or near the same time each of the net aggressors changes state, and $M^{(2)}$ is the mathematical expectation of the number of overlaps between the clock transition and each of N net aggressors within their respective timing windows during a time period TIME of, for example, 2.28 years.

The mathematical expectation $M^{(1)}$ may be expressed as:

$$M^{(1)}=P^{(1)}N^{(1)} \quad (14)$$

where $p^{(1)}$ is the probability that one clock net in the clock tree with n linear path segments (N is equal to m*n net aggressors) has a transition that overlaps with the timing windows of all net aggressors, and $N^{(1)}$ is the number of clock nets with n linear path segments in the clock tree. $N^{(1)}$ is equal to $Q_n*N_{clock}$, where $Q_n$ is the probability that a certain clock net has n linear path segments, and $N_{clock}$ is the number of clock nets in the clock tree.

FIG. 10A illustrates a histogram of a typical distribution of clock nets having n path segments used to calculate the probability $Q_n$ according to an embodiment of the present invention. In this example, the distribution is a normal distribution having a mean of n=3. The probability $Q_n$ is equal to the number of clock nets having n path segments divided by the total number of all path segments, that is, the sum of the number of path segments for every clock net in the clock tree.

The mathematical expectation $M^{(2)}$ may be expressed as:

$$M^{(2)}=P^{(2)}N^{(2)} \quad (15)$$

where $p^{(2)}$ is the probability that there is an overlap between a clock transition and a transition of each of N net aggressors within their respective timing windows during one clock cycle, and $N^{(2)}$ is the number of clock transitions during the period TIME, that is, $N^{(2)}$=TIME*F=$72 \times 10^6$*F, where F is the design clock frequency.

The following assumptions may be made to estimate the probability $p^{(1)}$ that one clock net in the clock tree with n linear path segments (N is equal to m*n net aggressors) has a transition that overlaps with a timing window of a net aggressor: (1) all net aggressors may be considered independent events; (2) every net aggressor is independent of every clock signal, including any clock signals in multiple clock domains and stages of clock nets; and (3) the worst case scenario is always considered on the conservative side, that is, the average timing window of net aggressors is greater than the clock ramptime:

$$TW > \tau_{clk} \quad (16)$$

where TW is the average timing window of a net aggressor and $\tau_{clk}$ is the clock ramptime.

FIG. 10B illustrates the geometrical probability of overlap between a clock transition and the timing window of a net aggressor according to an embodiment of the present invention. The timing window of a net aggressor $TW_s$ is not generally a random function with respect to the net aggressor s, however, the clock transition within the timing window may be considered as a random function. Accordingly, the number of clock transitions will not affect the mathematical expectation when accounting for different locations of the timing window with respect to the number of number of clock transitions.

If the timing window of a net aggressor plus the net aggressor ramptime ($TW_s+\tau_s$) overlaps with the clock transition or ramptime $\tau_{clk}$ interval, then the timing window of the net aggressor s is said to overlap the clock transition. It is assumed that a net aggressor s overlaps the clock transition so that the clock ramptime $\tau_{clk}$ is inside the timing window $TW_s$ of the net aggressor s. The number of net aggressors for a single path segment is assumed to be two, that is, m=2.

The path segments are assumed to have a normal length distribution with a small standard deviation, for example, less than five percent of the mean. This means that each path segment is assumed to have about the same length.

Using the assumptions set forth above, the probability $P^{(1)}$ that a clock net in the clock tree with n linear path segments (N is equal to m*n net aggressors) has a transition that overlaps with a timing window of a net aggressor may be estimated according to:

$$P^{(1)}=(P_{D>90\%}*P^m)^n \quad (17)$$

where $P_{D>90\%}$ is the probability that the wire density along a selected path segment is greater than 90 percent as a function of the average design wire density. If the probability that the wire density along a selected path segment is greater than 90 percent, the selected path segment is said to be completely surrounded by net aggressors.

FIG. 11 illustrates a plot 1100 of a probability mass function as a function of wire density along a path segment used to calculate $P_{D>90\%}$ according to an embodiment of the present invention. Shown in FIG. 11 are a density distribution of a path segment for an average design wire density of 60 percent 1102, a density distribution of a path segment for an average design wire density of 70 percent 1104, a density distribution of a path segment for an average design wire density of 80 percent 1106, and a density distribution of a path segment for an average design wire density of 90 percent 1108.

FIG. 12A illustrates a plot of $P_{D>90\%}$ as a function of average design wire density calculated from FIG. 11. Note that $P_{D>90\%}$=0.15 for designs having an average wire density of 80 percent. The probability P of a clock net overlapping a timing window of a net aggressor s may be expressed according to geometric probability properties as:

$$P = \lambda(\tau_{clk} + \tau_s + TW_s)/T \quad \text{if } (\tau_{clk} + \tau_s + TW_s) \le T \quad (18)$$

$$P = \lambda \quad \text{if } (\tau_{clk} + \tau_s + TW_s) > T$$

where $T=1/F$ is the clock signal period, and $\lambda \le 1$ indicates the reduction in probability of the overlap between the clock signal and the timing window of a net aggressor s compared to the probability of overlap between two independent random signals. Substituting equation (17) into equation (18) to solve for $P^{(1)}$ yields:

$$P^{(1)} = (P_{D>90\%}P^m)^n \quad (\tau_{clk} + \tau_s + TW_s) \le T \quad (19)$$

$$= (P_{D>90\%}(\lambda(\tau_{clk} + \tau_s + TW_s)/T)^m)^n$$

$$P^{(1)} = (P_{D>90\%}P^m)^n \quad (\tau_{clk} + \tau_s + TW_s) > T$$

$$= (P_{D>90\%}\lambda^m)^n$$

Substituting for worst case conditions, that is, for m=2 in equations (19), yields:

$$P^{(1)} = (P_{D>90\%}P^2)^n \quad (\tau_{clk} + \tau_s + TW_s) \le T \quad (20)$$

$$= (0.15(\lambda(\tau_{clk} + \tau_s + TW_s)/T)^2)^n$$

$$P^{(1)} = (P_{D>90\%}P^2)^n \quad (\tau_{clk} + \tau_s + TW_s) > T$$

$$= (0.15\lambda^2)^n$$

Substituting equation (20) into equation (14) to solve for $M^{(1)}$ yields:

$$M^{(1)} = P^{(1)}N^{(1)} \quad (\tau_{clk} + \tau_s + TW_s) \le T \quad (21)$$

$$= (P_{D>90\%}(\lambda(\tau_{clk} + \tau_s + TW_s)/T)^m)^n N^{(1)}$$

$$= (P_{D>90\%}(\lambda(\tau_{clk} + \tau_s + TW_s)/T)^m)^n Q_n N_{clk}$$

$$M^{(1)} = P^{(1)}N^{(1)} = (P_{D>90\%}\lambda^m)^n N^{(1)} \quad (\tau_{clk} + \tau_s + TW_s) > T$$

$$= (P_{D>90\%}\lambda^m)^n Q_n N_{clk}$$

where $Q_n$ is the probability that a selected clock net has n path segments, and $N_{clk}$ is the number of clock nets in the clock tree.

Substituting for worst case conditions, that is, for m=2 and $\lambda=1$ in equations (21) yields:

$$M^{(1)} = (0.015((\tau_{clk}+\tau_s+TW_s)/T)^2)^n Q_n N_{clk}(\tau_{clk}+\tau+TW_s) \le T \quad (22)$$

where T is the clock signal period.

The probability $P^{(2)}$ that a clock transition overlaps each of N net aggressors within their respective timing windows during one clock cycle may be expressed as:

$$P^{(2)} = (0.5\, P_a P_s)^N \quad (23)$$

where 0.5 is the probability that a net aggressor signal s will switch in a direction opposite to that of the clock signal. The probability $P_a$ is the probability that the net aggressor signal s will switch during a clock cycle, which typically has a value of about 7 percent. The probability $P_s$ is the probability that the net aggressor signal s will overlap the clock signal, which, may be expressed as:

$$P_S = \xi(\tau_{clk} + \tau_s)/TW_s \quad (\tau_{clk} + \tau_s) \le TW_s \quad (24)$$

$$P_S = \xi \quad (\tau_{clk} + \tau_s) > TW_s$$

where $\xi \le 1$ indicates the reduction in the probability of overlap between the clock signal transition and the net aggressor s signal transition compared to the probability of overlap between two independent random signals.

As stated above with regard to FIG. 10B, it is assumed that a net aggressor s overlaps the clock transition so that the clock ramptime $\tau_{clk}$ is inside the timing window $TW_s$ of the net aggressor s, that is, there is full overlap between the timing window $TW_s$ of the net aggressor signal and the clock signal. Accordingly, $P^{(2)}$ may be expressed as:

$$P^{(2)} = (0.5P_a\xi(\tau_{clk} + \tau_s)/TW_s)^{mn} \quad (\tau_{clk} + \tau_s) \le TW_s \quad (25)$$

$$(0.5P_a = \xi)^{mn} \quad (\tau_{clk} + \tau_s) > TW_s$$

Substituting equations (25) into equation (15) to solve for $M^{(2)}$ yields:

$$M^{(2)} = P^{(2)}N^{(2)} \quad (26)$$

$$= (0.5P_a\xi(\tau_{clk} + \tau_s)/TW_s)^{mn}N^{(2)}$$

$$= (0.5P_a\xi(\tau_{clk} + \tau_s)/TW_s)^{mn}N^{(2)} \quad \text{if } (\tau_{clk} + \tau_s) \le TW_s$$

$$M^{(2)} = P^{(2)}N^{(2)} = (0.5P_a\xi)^{mn}N^{(2)}$$

$$= (0.5P_a\xi)^{mn}72*10^6 F \quad \text{if } (\tau_{clk} + \tau_s) > TW_s$$

where F is equal to the design clock frequency. Substituting m=2 for worst case conditions in equations (26) yields:

$$M^{(2)} = P^{(2)}N^{(2)} \quad (27)$$

$$= (0.5P_a\xi(\tau_{clk} + \tau_s)/TW_s)^{mn}N^{(2)}$$

$$= (0.5P_a\xi(\tau_{clk} + \tau_s)/TW_s)^{mn}N^{(2)} \quad \text{if } (\tau_{clk} + \tau_s) \le TW_s$$

$$M^{(2)} = P^{(2)}N^{(2)} = (0.5P_a\xi)^{mn}N^{(2)}$$

$$= (0.5P_a\xi)^{mn}72*10^6 F \quad \text{if } (\tau_{clk} + \tau_s) > TW_s$$

The following crosstalk protection scheme is considered for a clock net having a fanout of one for use with any fanout value. The length of a path segment i may be expressed as dL(i), where L(i) is the total length of the clock net from the driver s to the end of the path segment i, so that:

$$L(i) = L(i-1) + dL(i) = dL(1) + dL(2) + \ldots + dL(i) \quad (28)$$

Solution (1):

$$dD = [d_p(L_p) + dD_{up}(L_{tot} - L_p)]M_{xt}(n) \quad (29)$$

$$\approx [(a_p - a_{up})L_p + a_{up}L_{tot}]M_{xt}(n)$$

where $M_{xt}(n)$ is a relaxation crosstalk multiplier between the net aggressors and the clock net.

FIG. 12B illustrates a plot of the relaxation crosstalk multiplier $M_{xt}(n)$ as a function of the number of path segments n in the selected clock net according to an embodiment of the present invention. The plot 1200 reveals that as the number of net aggressors increases, the value of the crosstalk multiplier $M_{xt}(n)$ increases to one for lower values of n.

Solving equation (29) for $L_p$ yields:

$$L_p=(dD_{max}/M_{xt}(n)-\alpha_{up}L_{tot})/(\alpha_p-\alpha_{up}) \quad (30)$$

Solution (1) assumes that the path segment lengths have a normal distribution. If this is not the case, then sufficient crosstalk protection may not be available, for example, if the first path segment is 90 percent of the total length $L_{tot}$ and the number of path segments n for the clock net is high, for example, more than four. A more conservative method of calculating the optimum protected path length is described as follows.

Solution (2):

FIG. 13 illustrates a flow chart 1300 of a method of calculating an optimum protected path length for a selected clock net according to an embodiment of the present invention.

Step 1302 is the entry point of the flow chart 1300.

In step 1304, an index i is initialized to zero, a path segment variable L(0) is initialized to zero, and an optimum protected path length $L_p$ is initialized to zero.

In step 1306, i is incremented by one.

In step 1308, if i is greater than the number of path segments n, then control is transferred to step 1330.

In step 1310, the path length from the driver s to the path segment i is calculated L(i)=L(i−1)+dL(i) is calculated according to equation (28).

In step 1312, the protected path length $L_p(i)$ for $L_{tot}$=L(i) is calculated by modifying equation (30) as follows:

$$L_p(i)=(dD_{max}/M_{xt}(i)-\alpha_{up}L(i))/(\alpha_p-+_{up}) \quad (31)$$

In step 1314, if $L_p(i)$ is less than or equal to zero, then control is transferred to step 1306; otherwise, control is transferred to step 1316.

In step 1316, a variable $L_{rest}$ is calculated according to:

$$L_{rest}=L_{tot}-L(i) \quad (32)$$

In step 1318, the protected length $L_p$ is calculated according to:

$$L_p=L_p(i)-L_{rest}M_{xt}(n) \quad (33)$$

In step 1320, if $L_p \leq 0$, then no protection is needed for the selected clock net, and control is transferred to step 1330; else if $L_p=L_{tot}$, then control is transferred to step 1322; else if $L_p<L_{tot}$, then control is transferred to step 1324; else if $L_p>L_{tot}$, then control is transferred to step 1328.

In step 1322, the current crosstalk protection scheme is selected for the entire length of the selected clock net $L_{tot}$, and control is transferred to step 1330.

In step 1324, the current protection scheme is selected for the protected net length $L_p$ of the clock net.

In step 1326, the placement of the protected net length $L_p$ near the front end of the clock net, that is, near the clock driver s, or near the back end of the clock net, that is, near the receiver t, is determined as described above, and control is transferred to step 1330.

In step 1328, a stronger type of crosstalk protection scheme is selected, and control is transferred to step 1304.

Step 1330 is the exit point of the flow chart 1300.

The following rules based on the delay model dD and the physics of signal propagation may be used individually and in combination to further optimize the crosstalk protection.

Rule (1). Incorporate skew correction information

Rule (1.1): If dS(s, t)=0, then no delay correction is required for the selected clock net. In this case, one of the following strategies may be selected: (a) use adequate crosstalk protection with optimization for the clock net as described above (default); or (b) protect the clock net as much as possible to avoid variations in $D_{min}$ and $D_{max}$ by using the strongest available type of crosstalk protection over the entire length $L_{tot}$ of the selected clock net.

Rule (1.2): If dS(s, t)∈[dS1, dS2], then the protected length $L_p$ may be reduced as follows:

$$L_p=(dD_{max}+D_{tolerance}-\alpha_{up}L_{tot})/(\alpha_p-\alpha_{up}) \quad (34)$$

where $$D_{tolerance}=\text{MIN}\{-dS1,dS2\} \quad (35)$$

and dS1≦0.

Rule (1.3): If dS(s, t)=dS1<0, then adequate crosstalk protection should be implemented that decreases clock net delay. For example, if the crosstalk protection scheme used is grid spacing, then the protected length $L_p$ should be implemented in front near the driver s of the clock net. On the other hand, if the crosstalk protection scheme used is metal shielding, then the protected length $L_p$ should be implemented near the end of the clock net, because increasing capacitance at the back end of the clock net has less effect on incremental delay than does increasing back end capacitance.

Rule (1.4): If dS(s, t)=dS2>0, then adequate crosstalk protection should be implemented that increases clock net delay. For example, if the crosstalk protection scheme used is grid spacing, then the protected length $L_p$ should be implemented near the end of the clock net. On the other hand, if the crosstalk protection scheme used is metal shielding, then the protected length $L_p$ should be implemented near the front of the clock net.

Rule (2). Evaluate different types of crosstalk protection schemes and possibly mixed crosstalk protection schemes to find the optimum crosstalk protection.

Rule (2.1): Any type of crosstalk protection scheme increases chip area.

Rule (2.2): A metal shielding crosstalk protection scheme increases chip area in proportion to $L_p$.

Rule (2.3): A grid spacing crosstalk protection scheme increases chip area in proportion to $L_p * \Delta_s$.

Rule (2.4): A metal shielding crosstalk protection scheme is superior to a grid spacing crosstalk protection scheme in terms of clock delay dD.

Rule (2.5): If dS(s, t)=dS1<0, then a metal shielding crosstalk protection scheme is inferior to a grid spacing crosstalk protection scheme is inferior to a grid spacing crosstalk protection scheme in terms of clock delay dD.

Rule (2.6): A grid spacing crosstalk protection scheme has a lower dD, D and clock signal ramptime with increasing values of $\Delta_s$.

Rule (2.7): A metal shielding crosstalk protection scheme having the same chip area as a grid spacing crosstalk protection scheme has less dD, but maximum values of D and clock signal ramptime.

Rule (2.8): A metal shielding crosstalk protection scheme is inferior to a grid spacing crosstalk protection scheme in terms of clock signal ramptime.

Rule (2.9): A crosstalk source coupled near the end of a clock net injects more crosstalk delay into the clock net than the same crosstalk source coupled near the front of the clock net, because the net aggressor is closer to the net destination.

Rule (3). Consider implementing different types of crosstalk protection schemes in the front or the end of the clock net to find the optimum protection.

Rule (3.1): Increasing the clock net capacitance by $\Delta_C$ near the front of the clock net increases the clock delay more than the same increase in clock net capacitance near the end of the clock net as explained above with regard to formula (10).

Rule (3.2): Decreasing the clock net capacitance by $\Delta_C$ near the end of the clock net decreases the clock delay less than the same decrease in clock net capacitance near the front of the clock net as explained above with regard to formula (10).

Rule (3.3): A crosstalk protection scheme implemented near the front of a clock net generally requires the least chip area, because all (s, t) paths in the clock net are protected.

Rule (3.4): A crosstalk protection scheme implemented near the end of a clock net is generally the most effective, because the crosstalk protection is closest to the destination.

Rule (3.5): A crosstalk protection scheme implemented near the front of a clock net is generally less effective than the same crosstalk protection scheme implemented near the end of a clock net.

Rule (3.6): A metal shielding crosstalk protection scheme implemented near the front of a clock net generally results in a lower increase in clock signal ramptime than implementing the metal shielding crosstalk protection scheme near the end of the clock net.

Rule (3.7): If dS(s, t)=dS1<0, then a metal shielding crosstalk protection scheme implemented near the front of a clock net generally results in a lower increase in total clock delay dD than implementing the metal shielding crosstalk protection scheme near the end of the clock net.

Rule (3.8): A metal shielding crosstalk protection scheme implemented near the end of a clock net generally results in a lower increase in incremental delay dD than implementing the metal shielding crosstalk protection scheme near the front of the clock net.

Rule (3.9): A grid spacing crosstalk protection scheme implemented near the end of a clock net generally results in a lower increase in total clock delay dD and clock signal ramptime than implementing the grid spacing crosstalk protection scheme near the front of the clock net.

Rule (3.10): If dS(s, t)=dS1<0, then a grid spacing crosstalk protection scheme implemented near the end of a clock net generally results in a lower increase in total clock delay dD.

Rule (4). Evaluate clock net fanout to find optimum crosstalk protection.

Rule (4.1): Compare all driver-receiver net paths (s, t) to find total clock delay dD timing violations.

Rule (4.2): Protect all net paths (s, t) with total clock delay dD timing violations.

Rule (4.3): Select a crosstalk protection scheme or a combination of crosstalk protection schemes that avoids total clock delay dD timing violations for all net paths (s, t) and that requires minimum additional chip area.

Rule (4.4): Always protect common path segments shared by two or more net paths (s, t) that have total clock delay dD timing violations.

Rule (4.5): Because the common path segments are generally closer to the driver s in a clock tree, use a metal shielding crosstalk protection scheme near the front of the net if dS(s, t)=dS1<0.

Rule (4.6): If a common path segment is protected with metal shielding, then use a grid spacing crosstalk protection scheme for the remaining portion of the protected path length $L_p$ if adequate protection is possible, otherwise use a metal shielding crosstalk protection scheme for the remaining portion of the protected path length $L_p$.

Some heuristics and user preferences (H-rules) may be specified by the user to resolve any possible conflicts among the rules given above, for example:

Rule (H1). Apply only the following set of rules from Rules 1, 2, 3 and 4: 1.2, 2.5, 3.9 and 4.6.

Rule (H2). Do not apply any of the following set of rules from Rules 1, 2, 3 and 4: 1.2, 2.5, 3.9 and 4.6.

Rule (H3). Select a grid spacing crosstalk protection scheme instead of a metal shielding crosstalk protection scheme where possible.

Rule (H4). Protect the front part of a clock net rather than the end part if the fanout is greater than one, and if there are multiple net paths (s, t) having total clock delay dD timing violations.

Rule (H5). Use a heuristic relaxation multiplier M for $L_p$ having a value equal to a number a less than one if the clock net fanout is greater than a number b, where a and b are selected by the user.

Rule (H6). Use a combination of partial crosstalk protection schemes to resolve a conflict among the rules, for example, select a grid spacing crosstalk protection scheme near the front (driver s) of the clock net and a metal shielding crosstalk protection scheme near the end of the clock net (receiver t).

In general, for each clock net there are several adequate partial crosstalk protection schemes that may differ in their quality characteristics according to a quality function Q=<chip area A, clock skew S, maximum ramptime $R_{max}$, maximum propagation delay $dD_{max}$>.

An intelligent engine for selecting the optimum partial crosstalk protection for a selected net that optimizes the quality function Q is described below. In this example, the intelligent engine prioritizes the factors that determine the quality function Q in the following order: chip area A (highest priority), clock skew S, maximum ramptime $R_{max}$, and maximum propagation delay $dD_{max}$ (lowest priority).

FIGS. 14A and 14B illustrates a flow chart 1400 for an intelligent engine according to an embodiment of the present invention.

Step 1402 is the entry point of the flow chart 1400.

In step 1404, the clock skew and net ramptime of a selected clock net are estimated from the synthesized clock tree by the clock tree analyzer as described above.

In step 1406, a best solution variable is initialized with no crosstalk protection, and a minimum value $Q_{min}$ of the quality function Q is initialized for the maximum possible values of chip area A, clock skew S, maximum ramptime $R_{max}$, and maximum propagation delay $dD_{max}$.

In step 1408, an initial type of partial crosstalk protection is selected for the selected clock net and an initial location in the selected clock net for placing the partial crosstalk protection is selected according to the H-rules and selected rules from Rules 1–4 as described above.

In step 1410, the incremental propagation delay $dD_{up}$ without crosstalk protection is calculated for each path segment (s, t) in the selected clock net from the library of pre-characterized crosstalk protection parameters.

In step 1412, if the number of timing violations in which the incremental propagation delay $dD_{up}$ without crosstalk protection exceeds the maximum propagation delay $dD_{max}$ is equal to zero, then control is transferred to step 1434; else if the number of timing violations in which incremental propagation delay $dD_{up}$ without crosstalk protection exceeds the maximum propagation delay $dD_{max}$ is equal to one, then control is transferred to step 1414; else if the number of timing violations in which incremental propagation delay $dD_{up}$ without crosstalk protection exceeds the maximum propagation delay $dD_{max}$ is greater than one, then control is transferred to step 1426.

In step 1414, a crosstalk protection scheme for the current path segment (s, t) is selected according to the library of pre-characterized crosstalk protection parameters, for example, as described in the flow chart 1300 of FIG. 13.

In step 1416, the value of the quality function Q is estimated using the current values of chip area A, clock skew S, maximum net ramptime $R_{max}$, and maximum propagation delay $dD_{max}$.

In step 1418, if the value of the quality function Q estimated in step 1416 is less than the minimum value $Q_{min}$, then control is transferred to step 1420. Otherwise, control is transferred to step 1422.

In step 1420, the best solution variable is set to the current partial crosstalk protection scheme, and the minimum value $Q_{min}$ is set to the value of the quality function Q estimated in step 1416.

In step 1422, if all types of partial crosstalk protection schemes and locations in the clock net for placing the crosstalk protection have been checked, then control transfers to step 1434. Otherwise, control is transferred to step 1424.

In step 1424, another type of partial crosstalk protection scheme or another location for placing the current partial crosstalk protection scheme is selected, and control is transferred to step 1412.

In step 1426, the current path segment (s, t) is set to the path segment having the maximum value of $dD-dD_{max}$.

In step 1428, a crosstalk protection scheme for the current path segment (s, t) is selected from the library of pre-characterized crosstalk protection parameters, for example, as described in the flow chart 1300 of FIG. 13.

In step 1430, if the number of path segments (s, t) remaining in the selected clock net for which the incremental propagation delay dD exceeds the maximum propagation delay $dD_{max}$ is equal to zero, then control is transferred to step 1432. Otherwise, control is transferred to step 1416.

In step 1432, the current path segment (s, t) is set to the unprotected part of the net path (s, t) having the maximum value of $dD-dD_{max}$, and control is transferred to step 1428.

In step 1434, the selected crosstalk protection scheme is generated as output.

Step 1436 is the exit point of the flow chart 1400.

When the intelligent engine loops through steps 1428, 1430 and 1432 to protect the remaining path segments having an incremental clock propagation delay dD timing violation, the intelligent engine can design a net path (s, t) having mixed types of partial crosstalk protection schemes.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

In another aspect of the present invention, the method illustrated in the flowchart description above may be embodied in a computer program product and implemented by a computer according to well known programming techniques to perform steps of:

(a) receiving a synthesized signal path structure and a value of maximum allowable injected crosstalk delay for a selected net in the signal path structure;

(b) analyzing the signal path structure to calculate a skew correction and a net ramptime for the selected net;

(c) estimating an injected crosstalk delay of the selected net from a net aggressor; and (d) selecting a crosstalk protection scheme for the selected net to minimize chip area of the integrated circuit while ensuring that the injected crosstalk delay of the selected net does not exceed the value of maximum allowable injected crosstalk delay.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of protecting a net against injected crosstalk delay comprising steps of:
   (a) receiving a synthesized signal path structure and a value of maximum allowable injected crosstalk delay for a selected net in the signal path structure;
   (b) analyzing the signal path structure to calculate a skew correction and a net ramptime for the selected net;
   (c) estimating an injected crosstalk delay of the selected net from a net aggressor; and
   (d) selecting a crosstalk protection scheme for the selected net to minimize chip area of the integrated circuit while ensuring that the injected crosstalk delay of the selected net does not exceed the value of maximum allowable injected crosstalk delay.

2. The method of claim 1 wherein step (d) comprises selecting a crosstalk protection scheme from a library of pre-characterized crosstalk protection parameters.

3. The method of claim 1 wherein step (d) comprises selecting a crosstalk protection scheme from one of a grid spacing crosstalk protection scheme and a metal shielding crosstalk protection scheme.

4. The method of claim 1 wherein step (d) comprises selecting a partial crosstalk protection scheme.

5. The method of claim 4 wherein step (d) comprises decreasing the clock skew correction.

6. The method of claim 4 wherein step (d) comprises decreasing the net ramptime in the selected net.

7. The method of claim 6 wherein step (d) further comprises selecting a location in the selected net for the partial crosstalk protection scheme to minimize the net ramptime in the selected net.

8. The method of claim 4 wherein step (d) further comprises selecting a location in the selected net for the partial crosstalk protection scheme to minimize injected crosstalk delay.

9. A method of protecting a net against injected crosstalk delay comprising steps of:
   (a) receiving as input a synthesized clock tree;
   (b) estimating clock skew and net ramptime of a selected clock net from the synthesized clock tree;
   (c) initializing a best solution variable with no crosstalk protection;
   (d) initializing a minimum value of the quality function for maximum possible values of chip area, clock skew, maximum net ramptime, and maximum propagation delay;
   (e) selecting a type of partial crosstalk protection for the selected clock net and a location in the selected clock net for placing the partial crosstalk protection according to a set of heuristic rules;
   (f) calculating an incremental propagation delay without crosstalk protection for each path segment in the selected clock net from the library of pre-characterized crosstalk protection parameters;
   (g) if the number of timing violations in which the incremental propagation delay without crosstalk protection exceeds the maximum propagation delay is equal to zero, then transferring control to step (s); else if the number of timing violations in which the incremental crosstalk delay without crosstalk protection exceeds the maximum propagation delay is equal to one, then transferring control to step (h); else if the number of timing violations in which the incremental crosstalk delay without crosstalk protection exceeds the maximum propagation delay is greater than one, then transferring control to step (o);

(h) selecting a crosstalk protection scheme for the current path segment according to a library of pre-characterized crosstalk protection parameters;

(i) estimating a value of the quality function from the current values of the chip area, the clock skew, the maximum net ramptime, and the maximum propagation delay;

(j) if the value of the quality function is less than the minimum value of the quality function, then transferring control to step (k); else transferring control to step (m);

(k) setting the best solution variable to the current partial crosstalk protection scheme;

(l) setting the minimum value of the quality function to the value of the quality function estimated in step (i);

(m) if all types of partial crosstalk protection schemes and all locations in the clock net for placing each crosstalk protection scheme have been checked, then transferring control to step (s); else transferring control to step (n);

(n) selecting another type of partial crosstalk protection scheme or another location in the selected clock net for placing the current partial crosstalk protection scheme and transferring control to step (g);

(o) setting the current path segment to a path segment having a maximum value of the incremental propagation delay minus the maximum propagation delay;

(p) selecting a crosstalk protection scheme for the current path segment from the library of pre-characterized crosstalk protection parameters;

(q) if the number of path segments remaining in the selected clock net for which the incremental clock propagation delay exceeds the maximum propagation delay is equal to zero, then transferring control to step (r); else transferring control to step (i);

(r) setting the current path segment to the path segment having the maximum value of the incremental propagation delay minus the maximum propagation delay and transferring control to step (p); and (s) generating as output the selected crosstalk protection scheme.

10. A computer program product for protecting a net against injected crosstalk delay comprising:
a medium for embodying a computer program for input to a computer; and
a computer program embodied in the medium for causing the computer to perform steps of:
(a) receiving a synthesized signal path structure and a value of maximum allowable injected crosstalk delay for a selected net in the signal path structure;
(b) analyzing the signal path structure to calculate a skew correction and a net ramptime for the selected net;
(c) estimating an injected crosstalk delay of the selected net from a net aggressor; and
(d) selecting a crosstalk protection scheme for the selected net to minimize chip area of the integrated circuit while ensuring that the injected crosstalk delay of the selected net does not exceed the value of maximum allowable injected crosstalk delay.

11. The computer program product of claim 10 wherein step (d) comprises selecting a crosstalk protection scheme from a library of pre-characterized crosstalk protection parameters.

12. The computer program product of claim 10 wherein step (d) comprises selecting a crosstalk protection scheme from one of a grid spacing crosstalk protection scheme and a metal shielding crosstalk protection scheme.

13. The computer program product of claim 10 wherein step (d) comprises selecting a partial crosstalk protection scheme.

14. The computer program product of claim 13 wherein step (d) comprises decreasing the clock skew correction.

15. The computer program product of claim 13 wherein step (d) comprises decreasing the net ramptime in the selected net.

16. The computer program product of claim 15 wherein step (d) further comprises selecting a location in the selected net for the partial crosstalk protection scheme to minimize the net ramptime in the selected net.

17. The computer program product of claim 15 wherein step (d) further comprises selecting a location in the selected net for the partial crosstalk protection scheme to minimize injected crosstalk delay.

18. A computer program product for protecting a net against injected crosstalk delay comprising:
a medium for embodying a computer program for input to a computer; and
a computer program embodied in the medium for causing the computer to perform steps of:
(a) receiving as input a synthesized clock tree;
(b) estimating clock skew and net ramptime of a selected clock net from the synthesized clock tree;
(c) initializing a best solution variable with no crosstalk protection;
(d) initializing a minimum value of the quality function for maximum possible values of chip area, clock skew, maximum net ramptime, and maximum propagation delay;
(e) selecting a type of partial crosstalk protection for the selected clock net and a location in the selected clock net for placing the partial crosstalk protection according to a set of heuristic rules;
(f) calculating an incremental propagation delay without crosstalk protection for each path segment in the selected clock net from the library of pre-characterized crosstalk protection parameters;
(g) if the number of timing violations in which the incremental propagation delay without crosstalk protection exceeds the maximum propagation delay is equal to zero, then transferring control to step (s); else if the number of timing violations in which the incremental crosstalk delay without crosstalk protection exceeds the maximum propagation delay is equal to one, then transferring control to step (h); else if the number of timing violations in which the incremental crosstalk delay without crosstalk protection exceeds the maximum propagation delay is greater than one, then transferring control to step (o);
(h) selecting a crosstalk protection scheme for the current path segment according to a library of pre-characterized crosstalk protection parameters;

(i) estimating a value of the quality function from the current values of the chip area, the clock skew, the maximum net ramptime, and the maximum propagation delay;

(j) if the value of the quality function is less than the minimum value of the quality function, then transferring control to step (k); else transferring control to step (m);

(k) setting the best solution variable to the current partial crosstalk protection scheme;

(l) setting the minimum value of the quality function to the value of the quality function estimated in step (i);

(m) if all types of partial crosstalk protection schemes and all locations in the clock net for placing each crosstalk protection scheme have been checked, then transferring control to step (s); else transferring control to step (n);

(n) selecting another type of partial crosstalk protection scheme or another location in the selected clock net for placing the current partial crosstalk protection scheme and transferring control to step (g);

(o) setting the current path segment to a path segment having a maximum value of the incremental propagation delay minus the maximum propagation delay;

(p) selecting a crosstalk protection scheme for the current path segment from the library of pre-characterized crosstalk protection parameters;

(q) if the number of path segments remaining in the selected clock net for which the incremental clock propagation delay exceeds the maximum propagation delay is equal to zero, then transferring control to step (r); else transferring control to step (i);

(r) setting the current path segment to the path segment having the maximum value of the incremental propagation delay minus the maximum propagation delay and transferring control to step (p); and (s) generating as output the selected crosstalk protection scheme.

* * * * *